United States Patent
Okabe

(10) Patent No.: US 8,879,645 B2
(45) Date of Patent: Nov. 4, 2014

(54) COMMUNICATION CIRCUIT AND SEMICONDUCTOR DEVICE

(71) Applicant: Renesas Electronics Corporation, Kawasaki (JP)

(72) Inventor: Shigeyuki Okabe, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/914,499

(22) Filed: Jun. 10, 2013

(65) Prior Publication Data

US 2014/0003562 A1     Jan. 2, 2014

(30) Foreign Application Priority Data

Jun. 27, 2012   (JP) ................................. 2012-143698

(51) Int. Cl.
*H04B 3/00*    (2006.01)
*H04L 25/00*   (2006.01)
*H04B 1/10*    (2006.01)
*H03K 19/003*  (2006.01)

(52) U.S. Cl.
CPC ........ *H04B 1/1081* (2013.01); *H03K 19/00346* (2013.01)
USPC ............................ 375/257; 375/347; 375/258

(58) Field of Classification Search
CPC ....... H04B 7/2609; H04B 7/084; H04L 12/66
USPC .................................. 375/257, 347, 221, 267
See application file for complete search history.

(56) References Cited

U.S. PATENT DOCUMENTS

| 6,744,823 | B1 * | 6/2004 | Kamemura et al. | 375/267 |
| 7,023,791 | B2 * | 4/2006 | Ueki | 369/275.3 |
| 7,286,611 | B2 * | 10/2007 | Kamemura et al. | 375/267 |
| 8,705,595 | B2 * | 4/2014 | Bailey et al. | 375/221 |
| 2004/0151265 | A1 * | 8/2004 | Fisher et al. | 375/347 |
| 2005/0069067 | A1 * | 3/2005 | Zerbe et al. | 375/353 |
| 2008/0112476 | A1 * | 5/2008 | Vong et al. | 375/224 |
| 2014/0003562 | A1 * | 1/2014 | Okabe | 375/347 |

FOREIGN PATENT DOCUMENTS

| JP | 2000-332548 A | 11/2000 |
| JP | 2003-133862 A | 5/2003 |
| WO | WO 00/70755 A | 11/2000 |

* cited by examiner

*Primary Examiner* — Qutbuddin Ghulamali
(74) *Attorney, Agent, or Firm* — McGinn IP Law Group, PLLC

(57) ABSTRACT

A communication circuit includes a receiver circuit that provides differential communication by using first and second transmission paths which transmit first and second signals. The receiver circuit includes a compensation circuit that compensates for the attenuation of a current when common mode noise is superimposed on the first signal and on the second signal. The compensation circuit includes a first compensation circuit and a second compensation circuit. The first compensation circuit detects an electric current attenuation of the first signal when the common mode noise is superimposed thereon, and compensates for the attenuation thereof by adding the detected electric current attenuation to the second signal. The second compensation circuit detects an electric current attenuation of the second signal when the common mode noise is superimposed thereon, and compensates for the attenuation thereof by adding the detected electric current attenuation to the first signal.

10 Claims, 15 Drawing Sheets

COMMUNICATION CIRCUIT AND SEMICONDUCTOR DEVICE

CROSS-REFERENCE TO RELATED APPLICATIONS

The disclosure of Japanese Patent Application No. 2012-143698 filed on Jun. 27, 2012 including the specification, drawings, and abstract is incorporated herein by reference in its entirety.

BACKGROUND

The present invention relates to a communication circuit and to a semiconductor device. More specifically, the present invention relates to a communication circuit and a semiconductor device that can be suitably used for differential communication between a plurality of voltage measurement devices capable of measuring a battery cell voltage.

Electric vehicles (EVs) and hybrid electric vehicles (HEVs), which use an electric motor as a driving source for running a vehicle, are developed not only by automobile manufacturers but also by various other companies and organizations. A vehicle-mounted power supply having a voltage as high as several hundred volts is necessary for driving such an electric motor. This type of vehicle-mounted power supply is implemented by an assembled battery that is obtained by series-coupling a plurality of unit cells (also called "battery cells") generating a voltage of several bolts.

For the electric vehicles and the like, the voltage of each battery cell VCL needs to be accurately measured in order to determine the status of a battery (e.g., an overcharged or overdischarged condition or the amount of remaining charge) in all operating environments such as vehicle running or charging. A high-precision battery voltage detection technology is essential to the effective use of battery energy. It is an important technology for vehicle safety assurance and mileage increase especially when it is applied to a vehicle power supply.

To fulfill the demand for such high precision and achieve cost reduction, voltage measurement devices commercialized for vehicle-mounted power supplies are mostly configured so that an analog-to-digital converter (hereinafter may be referred to as the ADC) is provided for each block of several to more than a dozen battery cells instead of being provided for each battery cell VCL. The voltage measurement devices incorporate a multiplexer circuit (hereinafter may be referred to as the MUX) in order to implement the above-mentioned configuration. The MUX makes voltage measurements by selecting battery voltages based on a plurality of different voltage references in a temporally sequential manner and using each selected battery voltage as a signal input to the ADC, which is designed with reference to the lowest potential (ground level (GND level)).

When the above-mentioned configuration is employed so that one ADC is provided for each bock of several to more than a dozen battery cells, a plurality of voltage measurement devices are provided for blocks of battery cells. Each of the voltage measurement devices includes a communication function section for exchanging control commands concerning battery monitoring, results of voltage measurements, and other information with another voltage measurement device. As a power supply voltage for operating each voltage measurement device is supplied from the associated block of battery cells, the communication between the voltage measurement devices is the communication between different potentials. It is preferred that electric-current communication be used as the communication between different potentials.

Further, differential communication is used as the electric-current communication. The differential electric-current communication is superior to single-ended electric-current communication in that the former can reduce signal amplitude to achieve a high data transmission rate.

A low common mode gain, high input impedance, balanced input/output differential amplifier circuit is described in Japanese Unexamined Patent Application Publication No. 2000-332548. This differential amplifier circuit receives, amplifies, and outputs a differential signal (paragraph 0013). Further, if an input common mode potential changes so that the non-inverted input potential of a differential input is higher or lower than the inverted input of the differential input, the potential of an input common mode control output increases or decreases as needed to eliminate a potential difference, thereby making adjustments to prevent a differential input section circuit from becoming saturated (paragraph 0015).

A technology for eliminating the influence of common mode noise on an input signal for a differential amplifier is described in Japanese Unexamined Patent Application Publication No. 2003-133862. This differential amplifier receives and amplifies a differential signal (paragraphs 0013, 0026, and 0027). The voltage at each input terminal of the differential amplifier is pulled down or pulled up in accordance with the potential of common mode noise Vn (paragraphs 0044 to 0048).

SUMMARY

As described above, the power supply voltage for operating each voltage measurement device is supplied from the associated block of battery cells (called "unit cells"). Therefore, the communication between the voltage measurement devices is the communication between different potentials. Hence, electric-current communication is more preferable as the communication between the voltage measurement devices than voltage communication. As regards the electric-current communication, the amount of communication current needs to be reduced in order to suppress the heat generation of a device and the amount of battery cell discharge. However, when the amount of communication current is small, a communication failure may occur because the communication is easily affected by common mode noise attributable to the rotary drive of an electric motor that acts as a driving source for running a vehicle. A communication failure may occur particularly when, for instance, a cascode-coupled current input stage is employed to increase the speed of communication. If, for instance, a current that results from common mode noise and has a negative polarity is added to a differential communication current between the voltage measurement devices, a signal level attenuates. Further, the communication current is oriented in a direction opposite to its correct direction depending on the level of the common mode noise. As a result, a receiving end cannot acquire an adequate level of the communication current.

Other problems and novel features will become apparent from the following description and from the accompanying drawings.

A representative means for solving the above problem is summarized below.

According to a representative aspect of the present invention, there is provided a communication circuit including a receiver circuit. The receiver circuit provides differential communication by using a first transmission path and a second transmission path. The first transmission path is used to transmit a first signal. The second transmission path is used to transmit a second signal. The second signal is in opposite phase to the first signal. The receiver circuit includes a compensation circuit that compensates for the attenuation of a current when common mode noise is superimposed on the first signal and on the second signal. The compensation circuit includes a first compensation circuit and a second compensation circuit. The first compensation circuit detects an electric current attenuation of the first signal when the common mode noise is superimposed on the first signal, and compensates for the attenuation of the first signal by adding the detected electric current attenuation to the second signal. The second compensation circuit detects an electric current attenuation of the second signal when the common mode noise is superimposed on the second signal, and compensates for the attenuation of the second signal by adding the detected electric current attenuation to the first signal.

An advantage provided by the representative means for solving the problem is summarized below.

In the receiver circuit that provides differential communication, the influence of common mode noise on electric-current communication can be reduced.

BRIEF DESCRIPTION OF THE DRAWINGS

Embodiments of the present invention will be described in detail based on the following figures, in which.

DETAILED DESCRIPTION

1. Overview of a Representative Embodiment

Figure 1:
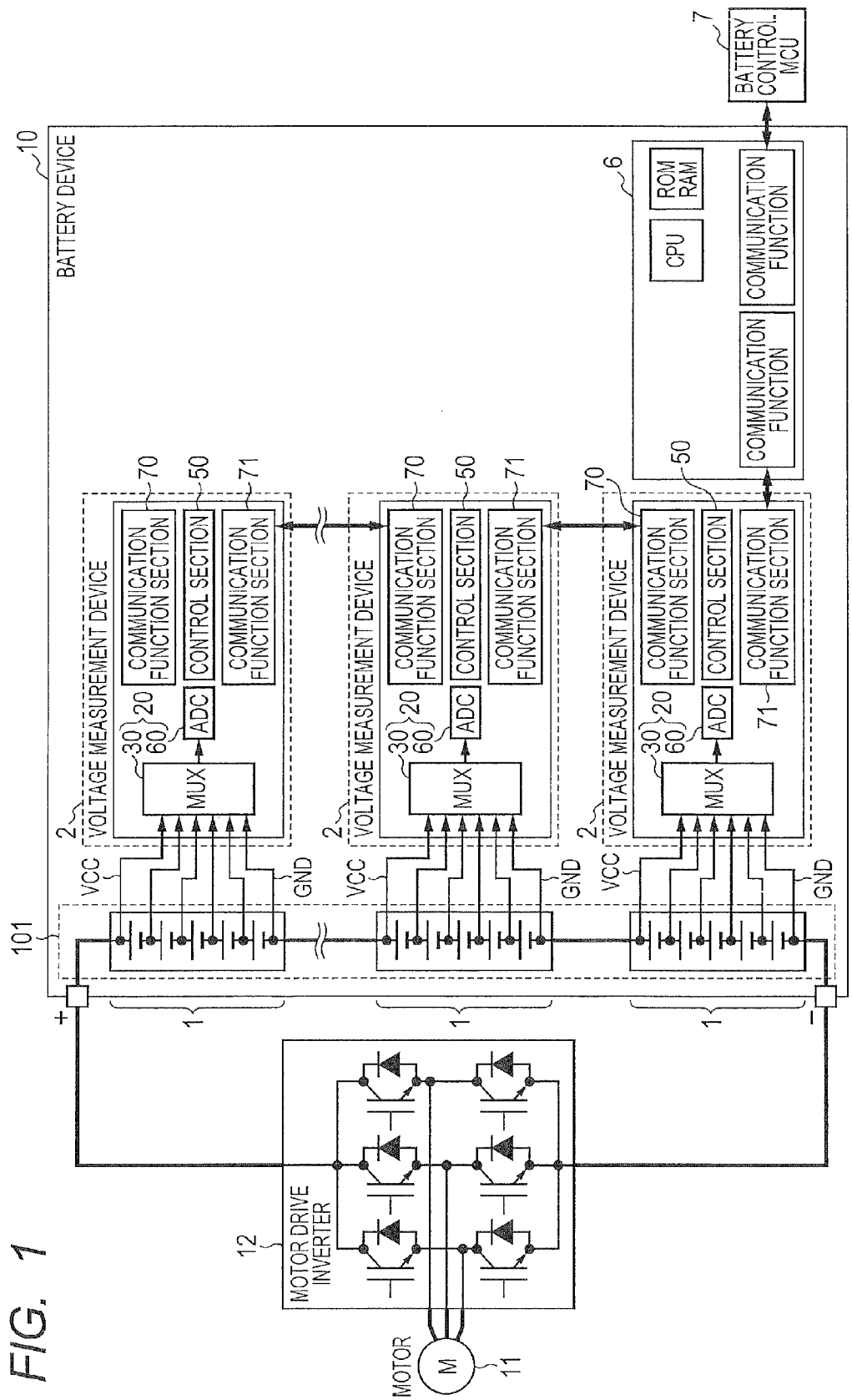
FIG. 1 is a block diagram illustrating an exemplary configuration of a battery device for an EV or HEV.

First of all, an embodiment representative of the present invention disclosed in this document will be summarized. The parenthesized reference numerals in the accompanying drawings referred to in the overview of the representative embodiment merely illustrate what is contained in the concept of elements to which the reference numerals are affixed. Although bipolar transistors shown in the drawings can be replaced by MOS transistors in some cases, the drawings show the bipolar transistors as examples. Although MOS transistors shown in the drawings can be replaced by bipolar transistors in some cases, the drawings show the MOS transistors as examples.

[1] A communication circuit (70, 71) according to the representative embodiment of the present invention includes a receiver circuit (42, 44). The receiver circuit (42, 44) provides differential communication by using a first transmission path (45, 47) and a second transmission path (46, 48). The first transmission path (45, 47) is used to transmit a first signal. The second transmission path (46, 48) is used to transmit a second signal. The second signal is in opposite phase to the first signal. The receiver circuit includes a compensation circuit that compensates for the attenuation of a current when common mode noise is superimposed on the first signal and on the second signal. The compensation circuit includes a first compensation circuit (95) and a second compensation circuit (96). The first compensation circuit (95) detects an electric current attenuation of the first signal when the common mode noise is superimposed on the first signal, and compensates for the attenuation of the first signal by adding the detected electric current attenuation to the second signal. The second compensation circuit (96) detects an electric current attenuation of the second signal when the common mode noise is superimposed on the second signal, and compensates for the attenuation of the second signal by adding the detected electric current attenuation to the first signal.

According to the above-described configuration, the receiver circuit includes the first and second compensation circuits, which are used to compensate for the electric current attenuation when common mode noise is superimposed on the first and second signals. Therefore, the receiver circuit can obtain a good signal level as it compensates for the attenuation caused by the common mode noise. This makes it possible to reduce the influence of the common mode noise on electric-current communication.

[2] In paragraph [1] above, the receiver circuit can be easily formed when it includes a first transistor (Q1, Q28) for acquiring the first signal while suppressing the influence of parasitic capacitance in the transmission path and a second transistor (Q2, Q29) for acquiring the second signal while suppressing the influence of parasitic capacitance in the transmission path. In this instance, the receiver circuit may also include a comparator (91, 103) for comparing the first signal, which is transmitted through the first transistor, to the second signal, which is transmitted through the second transistor.

[3] In paragraph [2] above, the first compensation circuit can be easily formed when it includes a third transistor (Q3) and a fourth transistor (Q4). The third transistor (Q3) is cascade-coupled to the first transistor. The fourth transistor (Q4) is current-mirror coupled to the third transistor to acquire the current to be added to the second signal. The second compensation circuit can be easily formed when it includes a fifth transistor (Q6) and a sixth transistor (Q5). The fifth transistor (Q6) is cascade-coupled to the second transistor. The sixth transistor (Q5) is current-mirror coupled to the fifth transistor to acquire the current to be added to the first signal.

[4] In paragraph [3] above, the fourth transistor is coupled so that a current flowing in the fourth transistor is added to the second signal before the comparator makes a comparison. The sixth transistor is coupled so that a current flowing in the sixth transistor is added to the first signal before the comparator makes a comparison. Using the above-described coupling scheme makes it possible to easily compensate for the attenuation caused by the common mode noise.

[5] In paragraph [4] above, the receiver circuit includes a first impedance adjustment circuit (108) and a second impedance adjustment circuit (109). The first impedance adjustment circuit (108) is used to adjust the input impedance of the receiver circuit as viewed from the first transmission path. The second impedance adjustment circuit (109) is used to adjust the input impedance of the receiver circuit as viewed from the second transmission path. The first impedance adjustment circuit decreases the input impedance of the receiver circuit as viewed from the first transmission path. The second impedance adjustment circuit decreases the input impedance of the receiver circuit as viewed from the second transmission path. When the input impedance is decreased as described above, the charge/discharge time for the parasitic capacitance can be reduced. This makes it possible to increase a signal transmission rate.

[6] In paragraph [5] above, the first impedance adjustment circuit can be easily formed when it includes a seventh transistor (Q30) and a first feedback circuit (Q32, Q34, Q36). The seventh transistor (Q30) is disposed between the first transistor and the second transistor. The first feedback circuit (Q32, Q34, Q36) is used to control the operation of the seventh transistor. In this instance, the first feedback circuit can be configured so as to control the operation of the seventh transistor (Q30) in accordance with the voltage at a series-coupled node (110) between the first transistor (Q1) and the seventh transistor (Q30). The second impedance adjustment circuit can be easily formed when it includes an eighth transistor (Q31) and a second feedback circuit (Q33, Q35, Q37). The eighth transistor (Q31) is disposed between the fourth transistor (Q2) and the fifth transistor (Q6). The second feedback circuit (Q33, Q35, Q37) is used to control the operation of the eighth transistor. In this instance, the second feedback circuit can be configured so as to control the operation of the eighth transistor (Q31) in accordance with the voltage at a series-coupled node (111) between the fourth transistor (Q2) and the eighth transistor (Q31).

[7] In paragraph [1] above, the receiver circuit can be easily formed when it includes a ninth transistor (Q53) for amplifying the first signal and a tenth transistor (Q56) for amplifying the second signal. In this instance, the receiver circuit may also include a comparator (91) for comparing the output of the ninth transistor to the output of the tenth transistor.

[8] In paragraph [7] above, the first compensation circuit can be easily configured when it includes an eleventh transistor (Q55), a twelfth transistor (Q57), and a thirteenth transistor (Q58). In this instance, the eleventh transistor (Q55) amplifies a current that flows in a direction opposite to the direction in which the first signal flows due to the common mode noise superimposed on the first signal. The twelfth transistor (Q57) forms a load on the eleventh transistor. The thirteenth transistor (Q58) is current-mirror coupled to the twelfth transistor to acquire the current to be added to the second signal before the comparator makes a comparison.

The second compensation circuit can be easily configured when it includes a fourteenth transistor (Q56), a fifteenth transistor (Q60), and a sixteenth transistor (Q59). In this instance, the fourteenth transistor (Q56) amplifies a current that flows in a direction opposite to the direction in which the second signal flows due to the common mode noise superimposed on the second signal. The fifteenth transistor (Q60) forms a load on the fourteenth transistor. The sixteenth transistor (Q59) is current-mirror coupled to the fifteenth transistor to acquire the current to be added to the first signal before the comparator makes a comparison.

[9] In paragraph [8] above, the thirteenth transistor is coupled so that a current flowing in the thirteenth transistor is added to the second signal before the comparator makes a comparison. The sixteenth transistor is coupled so that a current flowing in the sixteenth transistor is added to the first signal before the comparator makes a comparison. Using the above-described coupling scheme makes it possible to easily compensate for the attenuation caused by the common mode noise.

[10] In a semiconductor device including a voltage measurement function section (20), which measures the voltage of an assembled battery obtained by series-coupling a plurality of unit cells, and a communication function section (70, 71), which is capable of communicating a voltage measurement result produced by the voltage measurement function section, the communication function section can be configured in the same manner as the communication circuit.

2. Details of Preferred Embodiments

Embodiments of the present invention will now be described in further detail.

First Embodiment

FIG. 1 shows an exemplary configuration of a voltage measurement system of a battery for an EV or HEV.

Referring to FIG. 1, an electric motor 11 is driven when the battery supplies electric power across an electric motor drive inverter 12. A battery device 10 included in the voltage measurement system shown in FIG. 1 includes a battery 101, a plurality of voltage measurement devices 2, and a battery monitoring microcomputer (MCU) 6. The battery 101 includes assembled batteries having a plurality of series-coupled unit cells. Each voltage measurement device 2 is allocated to each block of several to more than a dozen battery cells 1 included in the battery. The battery 101 mounted, for instance, in an electric vehicle includes several hundred unit cells. The highest-level voltage of the battery 101 is, for example, 400 V or so. The unit cells included in the battery 101 are, for example, lithium-ion cells.

The battery monitoring microcomputer (MCU) 6 includes a CPU (Central Processing Unit), a ROM (Read-Only Memory), a RAM (Random-Access Memory), and a communication function, and is formed over a semiconductor substrate, such as a monocrystalline silicon substrate, by a well-known semiconductor integrated circuit manufacturing technology. The battery monitoring microcomputer 6 controls the voltage measurement devices 2 to make battery voltage measurements, and controls the electric power supply from the battery to the electric motor drive inverter 12 in accordance with the results of the measurements. Further, the battery monitoring microcomputer 6 establishes CAN (Control Area Network) communication or the like with a battery control microcomputer 7.

Each voltage measurement device 2 includes a voltage measurement function section 20, a control section 50, and communication function sections 70, 71, and is formed over a semiconductor substrate, such as a monocrystalline silicon substrate, by a well-known semiconductor integrated circuit manufacturing technology. The voltage measurement function section 20 includes an MUX 30 and an ADC 60.

To measure the voltage of a target block of battery cells 1 included in the battery 101, the MUX 30 selectively couples the terminals of the battery cells 1 to the ADC 60. The ADC 60 measures the voltage of a battery cell 1 selected by the MUX 30 in accordance with a control signal from the control section 50, and outputs the result of the measurement. The communication function sections 70, 71 mutually communicate, for example, control commands from the battery monitoring microcomputer 6 and voltage measurement results from the ADC 60 between neighboring voltage measurement devices 2.

Figure 2:
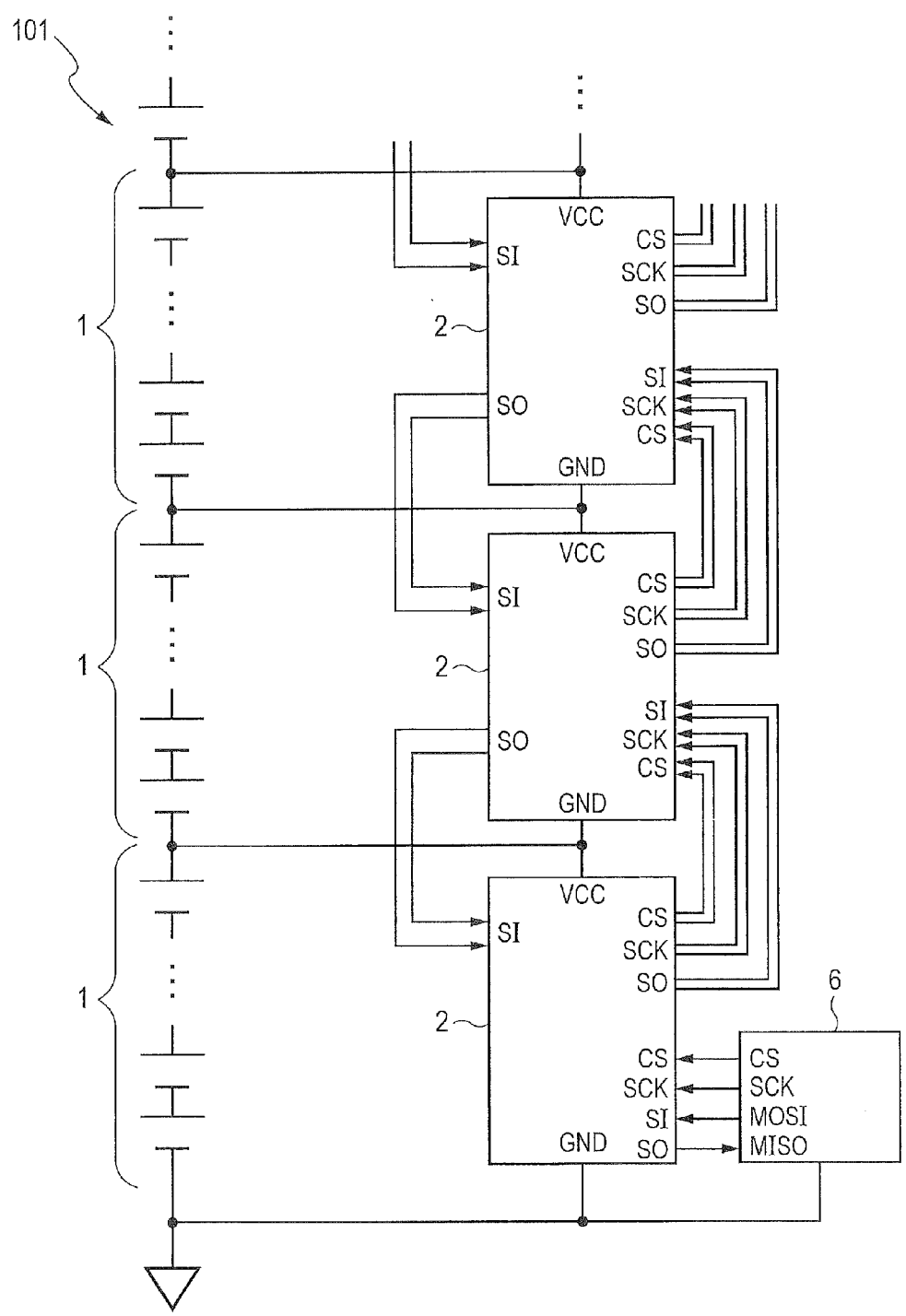
FIG. 2 is a diagram illustrating how a plurality of voltage measurement devices and a battery monitoring microcomputer are coupled.

FIG. 2 shows how the voltage measurement devices 2 and the battery monitoring microcomputer 6 are coupled.

The voltage measurement devices 2 and the battery monitoring microcomputer 6 include a serial interface that establishes serial communication. The battery monitoring microcomputer 6 includes a chip select terminal CS, a serial clock terminal SCK, a data output terminal MOSI, and a data input terminal MISO. The voltage measurement devices 2 include a chip select terminal CS, a serial clock terminal SCK, a serial data output terminal SO, and a serial data input terminal SI. The chip select terminal CS, serial clock terminal SCK, data output terminal MOSI, and data input terminal MISO of the battery monitoring microcomputer 6 are coupled to the chip select terminal CS, serial clock terminal SCK, serial data input terminal SI, and serial data output terminal SO of a voltage measurement device 2, respectively. Single-ended transmission type or differential transmission type voltage communication is established between the voltage measurement device 2 and the battery monitoring microcomputer 6. Differential transmission for transmitting data with a pair of signal wires takes place between the neighboring voltage measurement devices 2. In the differential transmission, a pair of transmission paths transmit signals so that the signal transmitted through one transmission path is in opposite phase to the signal transmitted through the other transmission path. Each voltage measurement device 2 includes a power supply terminal for acquiring a power supply voltage VCC referenced to a ground GND. A power supply voltage for operating a voltage measurement device 2 is supplied from a series-coupled node for the associated unit cell. The operating power supply voltage is determined by the device withstand voltage of the voltage measurement device 2, the number of coupled unit cells, and the voltage per unit cell. When, for instance, the voltage per unit cell is between 1.4 V and 5 V and twelve unit cells are coupled to the voltage measurement device 2, the operating power supply voltage is between 16.8 V and 60 V. In this instance, the device withstand voltage needs to be at least 60 V. Electric-current communication is established between the neighboring voltage measurement devices 2.

The communication function sections 70, 71 each include a transmitter circuit and a receiver circuit. As shown, for instance, in FIG. 3, the transmitter circuit 41 in the communication function section 70 and the receiver circuit 42 in the communication function section 71 are used to transmit a signal from a voltage measurement device 2 whose power supply voltage VCC is the potential at a node N1 in the battery 101 to a voltage measurement device 2 whose power supply voltage VCC is the potential at a node N2 in the battery 101. In this instance, the transmitter circuit 41 and the receiver circuit 42 are coupled through a pair of transmission paths 45, 46 to establish differential communication. When a current INp provided by a first signal flows in one transmission path 45, a current INn provided by a second signal flows in the other transmission path 46. The second signal is in opposite phase to the first signal.

In some cases, common mode noise Ncom may be superimposed on the first signal INp and on the second signal INn. Details will be described later.

Figure 3:
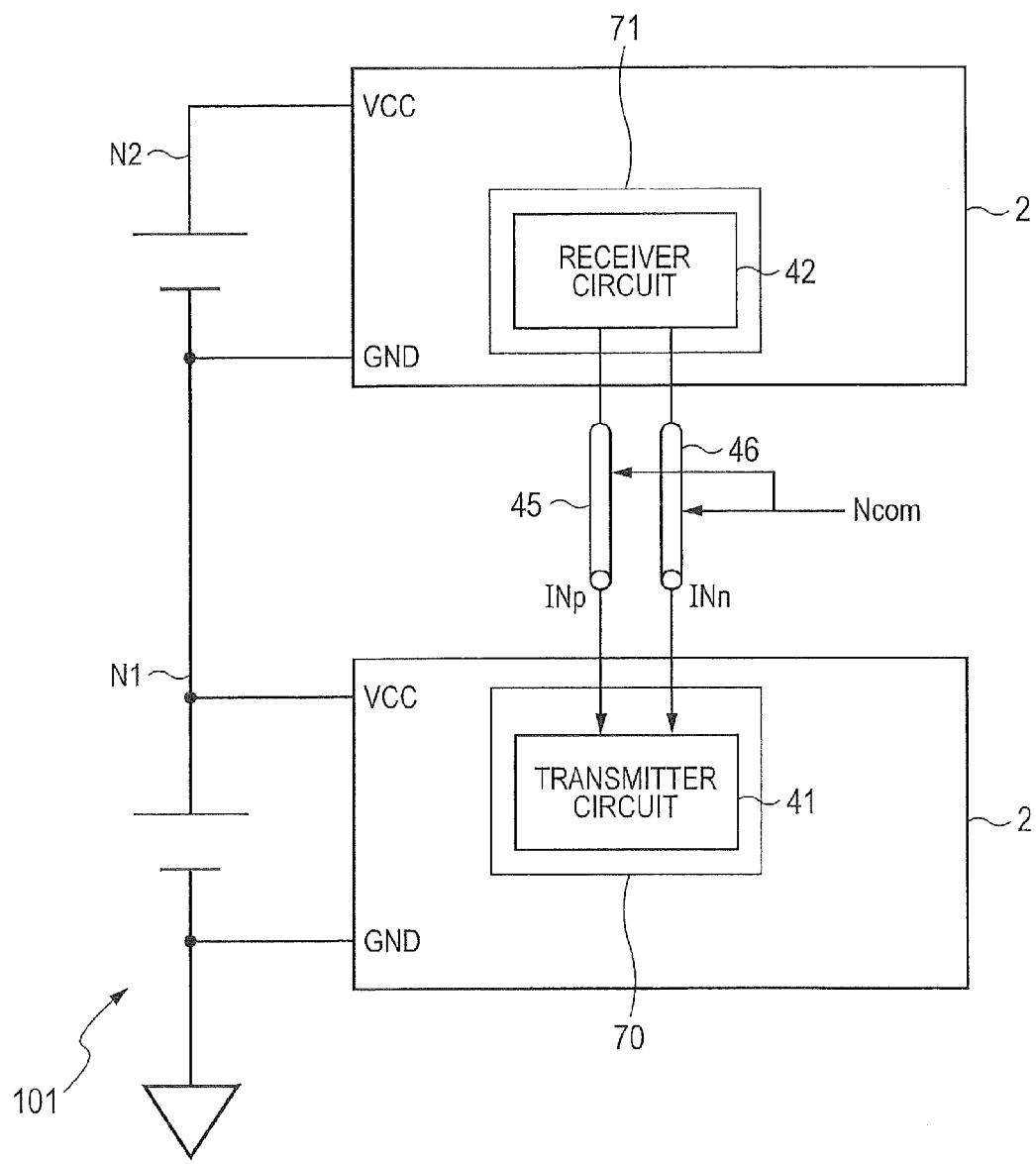
FIG. 3 is a diagram illustrating how a transmitter circuit and a receiver circuit are coupled in a communication function section included in the battery device shown in FIG. 1.
Figure 9:
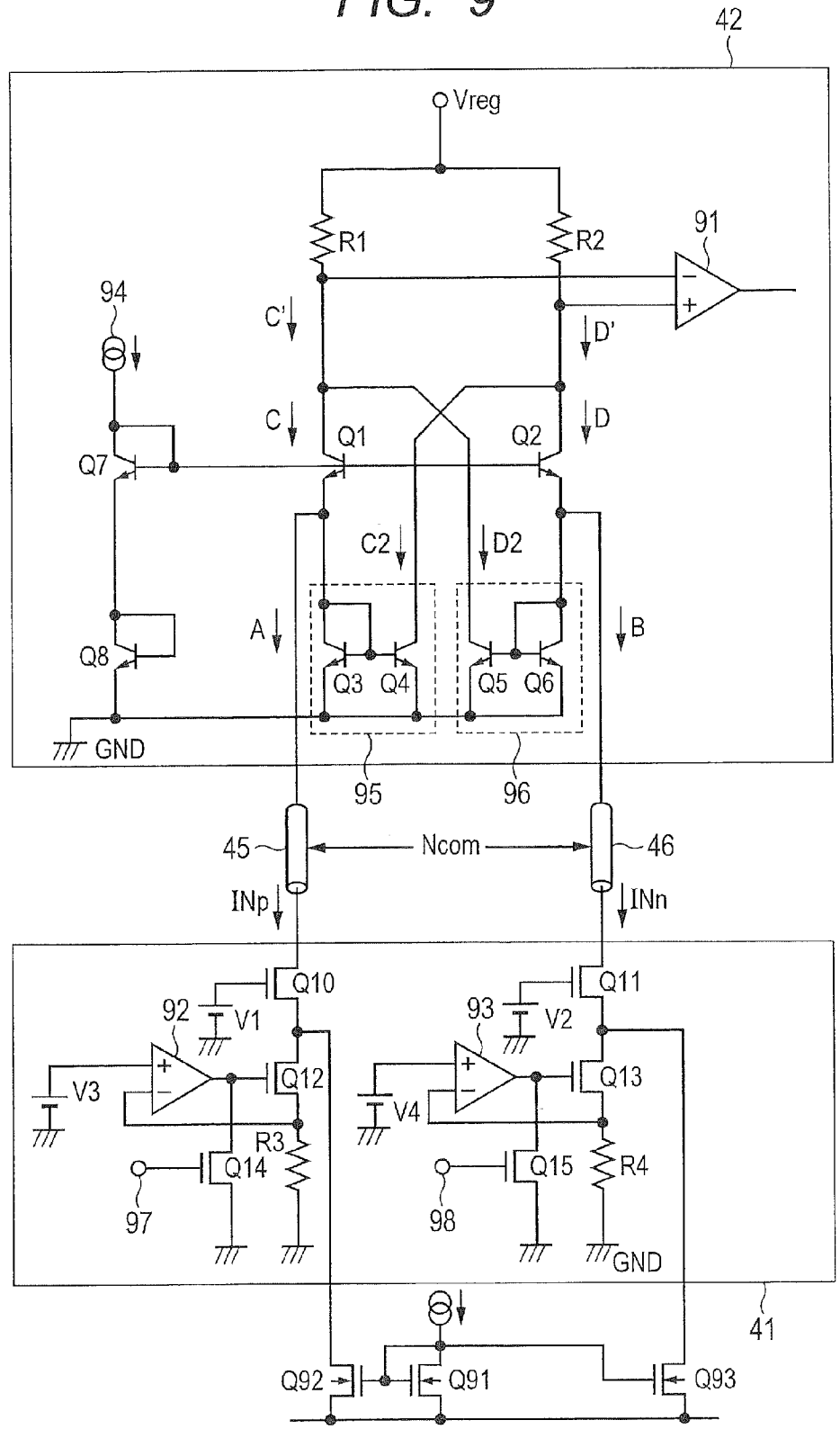
FIG. 9 is a circuit diagram illustrating an exemplary configuration of the transmitter circuit and receiver circuit shown in FIG. 3.

FIG. 9 shows an exemplary configuration of the transmitter circuit 41 and receiver circuit 42 shown in FIG. 3.

The transmitter circuit 41 is configured as described below.

A resistor R3 and n-channel MOS transistors Q10, Q12 are series-coupled to each other. A high-voltage element is used as the n-channel MOS transistor Q10. The drain electrode of the re-channel MOS transistor Q10 is coupled to the transmission path 45. A reference voltage V1 is supplied to the gate electrode of the n-channel MOS transistor Q10 so that a predefined voltage drop occurs between the gate and source electrodes of the n-channel MOS transistor Q10 to prevent a high voltage from being applied to the n-channel MOS transistor Q12. An amplifier 92 is provided to virtually define the potential of the source electrode of the n-channel MOS transistor Q12 and a reference voltage V3. The output signal of the amplifier 92 is transmitted to the gate electrode of the n-channel MOS transistor Q12. An n-channel MOS transistor Q14 is disposed between the gate electrode of the re-channel MOS transistor Q12 and the ground GND. Transmitted data is conveyed to the gate electrode of the n-channel MOS transistor Q14 through an input terminal 97. In response to the transmitted data, the current INp provided by the first signal flows in the transmission path 45. A current mirror circuit (n-channel MOS transistors Q91, Q92) is coupled to the source of the n-channel MOS transistor Q10 to ensure that the source current of the re-channel MOS transistor Q10 is not completely 0 (zero).

Further, n-channel MOS transistors Q11, Q13 and a resistor R4 are series-coupled to each other. A high-voltage element is used as the n-channel MOS transistor Q11. The drain electrode of the n-channel MOS transistor Q11 is coupled to the transmission path 46. A reference voltage V2 is supplied to the gate electrode of the n-channel MOS transistor Q11 so that a predefined voltage drop occurs between the gate and source electrodes of the n-channel MOS transistor Q11 to prevent a high voltage from being applied to the n-channel MOS transistor Q13. An amplifier 92 is provided to virtually define the potential of the source electrode of the n-channel MOS transistor Q13 and a reference voltage V4. The output signal of the amplifier 93 is transmitted to the gate electrode of the n-channel MOS transistor Q13. An n-channel MOS transistor Q15 is disposed between the gate electrode of the n-channel MOS transistor Q13 and the ground GND. Transmitted data is conveyed to the gate electrode of the n-channel MOS transistor Q15 through an input terminal 98. In response to the transmitted data, the current INn provided by the second signal flows in the transmission path 46. A current mirror circuit (n-channel MOS transistors Q91, Q93) is coupled to the source of the n-channel MOS transistor Q11 to ensure that the source current of the n-channel MOS transistor Q11 is not completely 0 (zero).

The receiver circuit 42 is configured as described below.

The receiver circuit 42 includes bipolar transistors Q1 to Q8, resistors R1, R2, and a comparator 91. The bipolar transistors Q1 to Q8 are of an npn type. The collector electrodes of the bipolar transistors Q1, Q2 are coupled to a constant voltage Vreg terminal through the resistors R1, R2, respectively. The constant voltage Vreg is, for example, 5 V and obtained by decreasing the power supply voltage VCC with a voltage down converter. In the present embodiment, a cascode input circuit is employed to prevent a signal transmission rate from being decreased by parasitic capacitance in a transmission path. This makes it possible to increase the values of the resistors R1, R2 and provide an adequate input voltage for the comparator 91. To inhibit the signal transmission rate from being decreased by the parasitic capacitance without employing the cascode input circuit, it is necessary to reduce a voltage drop in the resistors R1, R2 by decreasing the values of the resistors R1, R2. In this instance, an adequate input voltage may not be provided for the comparator 91. More specifically, the emitter electrode of the bipolar transistor Q1 is coupled to the transmission path 45 in order to acquire the first signal, whereas the emitter electrode of the bipolar transistor Q2 is coupled to the transmission path 46 in order to acquire the second signal. The bipolar transistor Q1 functions as a current buffer for supplying a current to the transmission path 45 for the purpose of transmitting the first signal. The bipolar transistor Q2 functions as a current buffer for supplying a current to the transmission path 46 for the purpose of transmitting the second signal. A predetermined bias voltage is supplied to the base electrode of each bipolar transistor Q1, Q2. This bias voltage is formed by a constant current source 94 and by the bipolar transistors Q7, Q8, which are series-coupled to the constant current source 94. The bipolar transistors Q7, Q8 function as a diode as their collector electrode and base electrode are coupled together. The comparator 91 compares the potential at a series-coupled node between the resistor R1 and the bipolar transistor Q1 to the potential at a series-coupled node between the resistor R2 and the bipolar transistor Q2. The result of the comparison made by the comparator 91 is used as a received signal that is received by the receiver circuit 42 during differential communication.

The receiver circuit 42 also includes a first compensation circuit 95 and a second compensation circuit 96. The first and second compensation circuit 95, 96 compensate for the attenuation of a current when common mode noise is superimposed on the first signal in the transmission path 45 and on the second signal in the transmission path 46.

The first compensation circuit 95 is used to compensate for the attenuation of the first signal by detecting a portion of the first signal transmitted through the transmission path 45 that is beyond a predetermined input range and adding the detected portion to the second signal. The first compensation circuit 95 includes the bipolar transistor Q3, which is cascade-coupled to the bipolar transistor Q1, and the bipolar transistor Q4, which is current-mirror coupled to the bipolar transistor Q3. When a current flowing in a direction opposite to the direction of the first signal flows in the bipolar transistor Q3 due to the common mode noise superimposed on the first signal flowing in the transmission path 45, a corresponding current flows in the bipolar transistor Q4. This current is supplied through the resistor R2 and added to the second signal, which is to be transmitted to the comparator 91.

The second compensation circuit 96 is used to compensate for the attenuation of the first signal by detecting a portion of the second signal transmitted through the transmission path 46 that is beyond a predetermined input range and adding the detected portion to the first signal. The second compensation circuit 96 includes the bipolar transistor Q6, which is cascade-coupled to the bipolar transistor Q2, and the bipolar transistor Q5, which is current-mirror coupled to the bipolar transistor Q6. When a current flowing in a direction opposite to the direction of the second signal flows in the bipolar transistor Q6 due to the common mode noise superimposed on the second signal flowing in the transmission path 46, a corresponding current flows in the bipolar transistor Q5. This current is supplied through the resistor R1 and added to the first signal, which is to be transmitted to the comparator 91.

Operations performed when common mode noise Ncom is superimposed on signals in the transmission paths 45, 46 will now be described.

For the sake of explanation, it is assumed that a current A flows to an end of the transmission path 45 toward the receiver circuit 42, and that a current B flows to an end of the transmission path 46 toward the receiver circuit 42, and further that a current C flows to the collector electrode side of the bipolar transistor Q1, and still further that a current D flows to the collector electrode side of the bipolar transistor Q2. It is also assumed that a current C' flows in a path from a joint between the collector electrode of the bipolar transistor Q1 and the collector electrode of the bipolar transistor Q5 to the resistor R1, and that a current D' flows in a path from a joint between the collector electrode of the bipolar transistor Q2 and the collector electrode of the bipolar transistor Q4 to the resistor R2. It is still also assumed that a current C2 flows to the collector electrode of the bipolar transistor Q4, and that a current D2 flows to the collector electrode of the bipolar transistor Q5.

Figure 5:
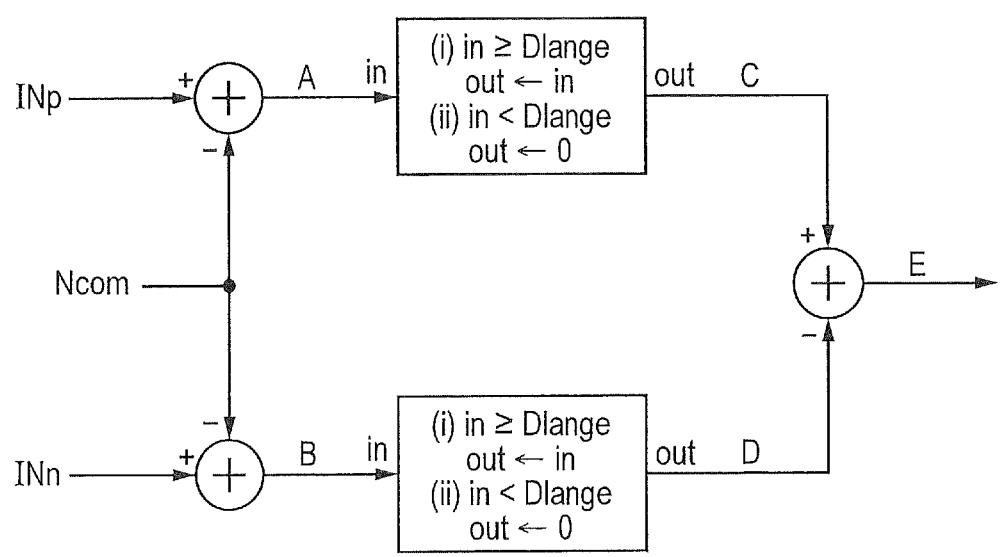
FIG. 5 is a diagram illustrating signal flows that occur when a first compensation circuit and a second compensation circuit are not included as shown in FIG. 9.
Figure 6:
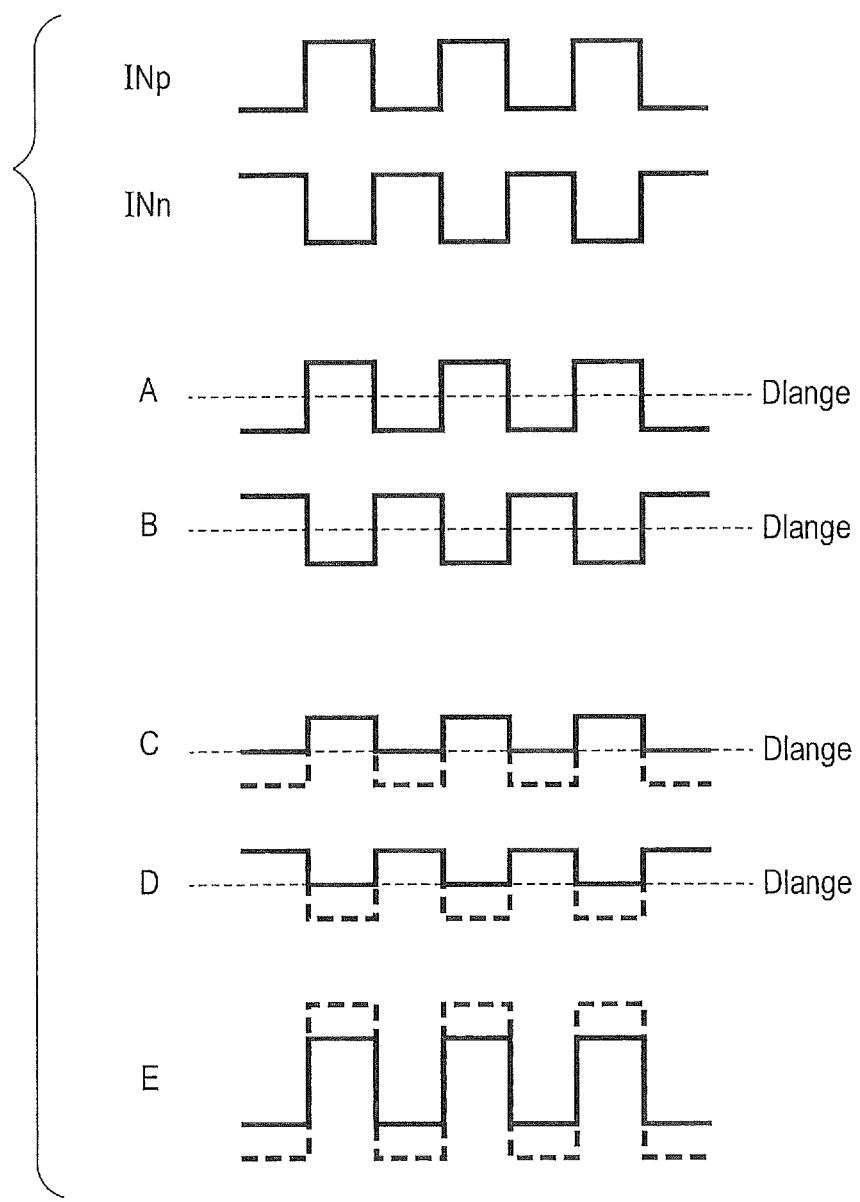
FIG. 6 is a diagram illustrating the current waveforms of essential parts shown in FIG. 5.

FIG. 5 shows signal flows that occur when the first compensation circuit 95 and the second compensation circuit 96 are not included as shown in FIG. 9. FIG. 6 shows the current waveforms of essential parts shown in FIG. 5.

The current INp provided by the first signal flows in the transmission path 45. The current INn provided by the second signal flows in the transmission path 46. In the present embodiment, it is assumed that a current resulting from common mode noise Ncom and having a negative polarity is added to the current INp provided by the first signal and to the current INn provided by the second signal. Such an addition may attenuate a signal level so that the current A and the current B flow in an opposite direction depending on the level of the common mode noise Ncom.

In the receiver circuit 42, the first signal in the transmission path 45 is transmitted to the emitter electrode of the bipolar transistor Q1, whereas the second signal in the transmission path 46 is transmitted to the emitter electrode of the bipolar transistor Q2. It is therefore necessary that a signal current be above a predetermined reference level. The reference level Dlange for the signal current is, for example, 0 amperes. When the receiver circuit 42 is to acquire a signal, the current A and the current B need to be above the reference level Dlange. When the current A (input in) is not below the reference level Dlange (in≥Dlange), the current C is equal to the input in. When the current A (input in) is below the reference level Dlange (in<Dlange), the current C is 0 (zero). Similarly, when the current B (input in) is not below the reference level Dlange (in≥Dlange), the current D is equal to the input in. When the current B (input in) is below the reference level Dlange (in<Dlange), the current D is 0 (zero). In other words, when the input current is below the reference level and flows in an opposite direction, no emitter current is allowed to flow in the bipolar transistors Q1, Q2. Hence, the receiver circuit 42 can acquire no signal. As described above, when the current A and the current B are below the reference level, they cannot be acquired as a received signal. Therefore, the current C and the current D attenuate so that the difference E between the current C and the current D also attenuates.

On the other hand, when the first compensation circuit 95 and the second compensation circuit 96 are included, a current is allowed to flow in the bipolar transistors Q3, Q6 even if the input current is below the reference level. Thus, the attenuation of the current can be compensated for when common mode noise is superimposed on the first signal and on the second signal. In other words, even when the input current is below the reference level, a current flows in the bipolar transistor Q3 so that a corresponding current flowing in the bipolar transistor Q4 is added to the current D flowing in the bipolar transistor Q2. This addition results in the flow of the current D'. Similarly, even when the input current is below the reference level, a current flows in the bipolar transistor Q6 so that the corresponding current D2 flowing in the bipolar transistor Q5 is added to the current C flowing in the bipolar transistor Q1. This addition results in the flow of the current C'. The above current additions compensate for the attenuation caused by common mode noise as described below.

Figure 7:
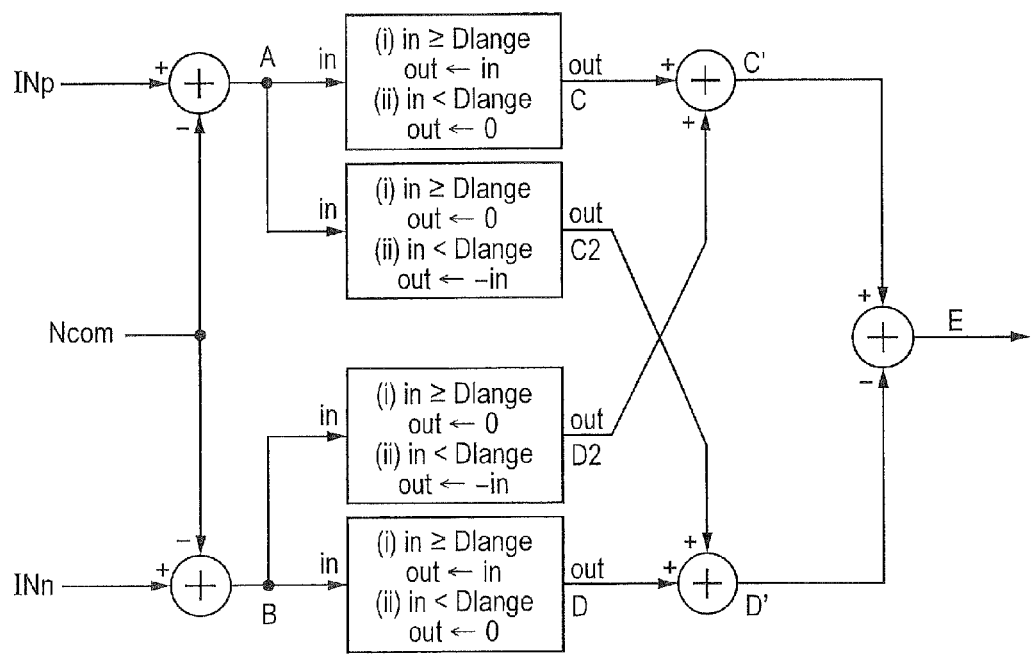
FIG. 7 is a diagram illustrating signal flows that occur when a configuration shown in FIG. 9 is employed.
Figure 8:
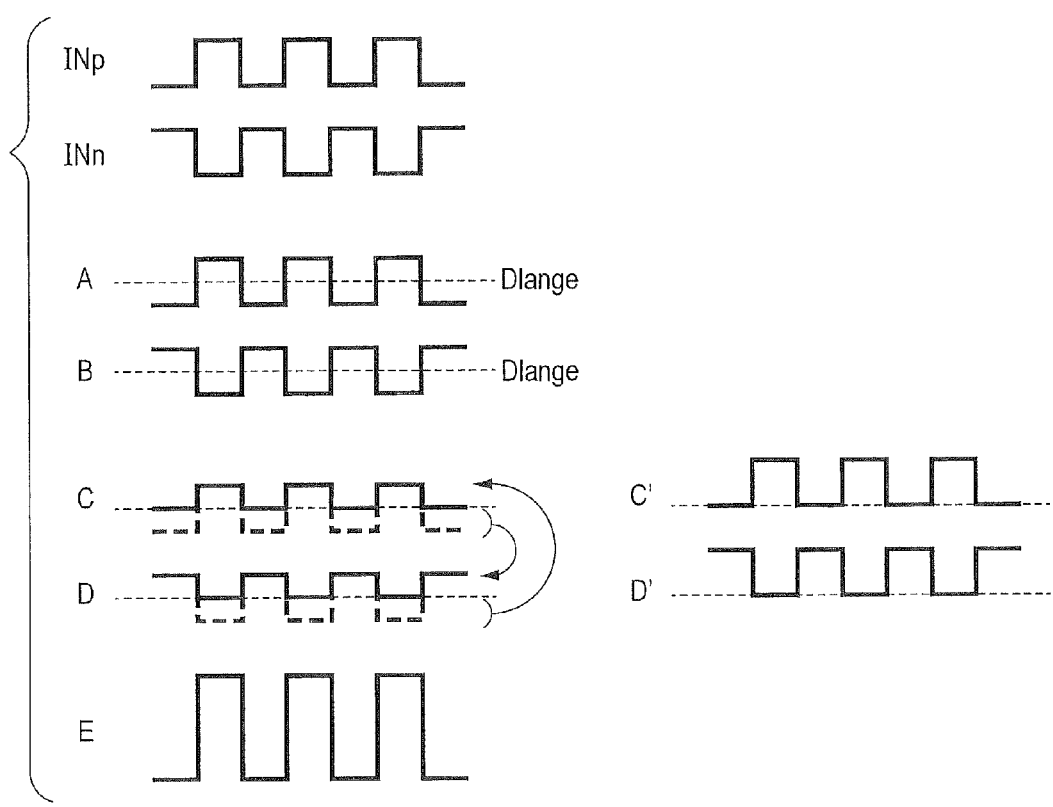
FIG. 8 is a diagram illustrating the current waveforms of essential parts shown in FIG. 7.

FIG. 7 shows signal flows that occur when a configuration shown in FIG. 9 is employed. FIG. 8 shows the current waveforms of essential parts shown in FIG. 7.

In a situation where the first compensation circuit 95 and the second compensation circuit 96 are included, the current C2 is 0 (zero) if the current A is not below the reference level Dlange (in≥Dlange), and the sign of the current A is inverted to produce the current C2 if the current A is below the reference level Dlange (in<Dlange). The current C2 is added to the current D. Thus, the current D' is the sum of the current D and the attenuation of the current INp. Similarly, the current D2 is 0 (zero) if the current B is not below the reference level Dlange (in≥Dlange), and the sign of the current B is inverted to produce the current D2 if the current B is below the reference level Dlange (in<Dlange). The current D2 is added to the current C. Thus, the current C' is the sum of the current C and the attenuation of the current INn. As a result, the difference E between the current C' and the current D' has a good signal level because the attenuation caused by common mode noise is compensated for.

An operational advantage provided by the first embodiment is described below.

The receiver circuit 42 includes the first compensation circuit 95 and the second compensation circuit 96, which compensate for the attenuation of a current when common mode noise is superimposed on the first signal and on the second signal. Therefore, the receiver circuit 42 can compensate for the attenuation caused by the common mode noise and obtain a good signal level.

Second Embodiment

A transmitter circuit 43 and a receiver circuit 44, which are both included in the communication function section 71, are used for signal transmission from the voltage measurement device 2 whose power supply voltage VCC is the potential at the node N2 in the battery 101 to the voltage measurement device 2 whose power supply voltage VCC is the potential at the node N1 in the battery 101. In this instance, the transmitter circuit 43 and the receiver circuit 44 are coupled through a pair of transmission paths 47, 48 for differential communication. When the current INp provided by the first signal flows in the transmission path 47, the current INn provided by the second signal flows in the other transmission path 48. The second signal is in opposite phase to the first signal.

Figure 4:
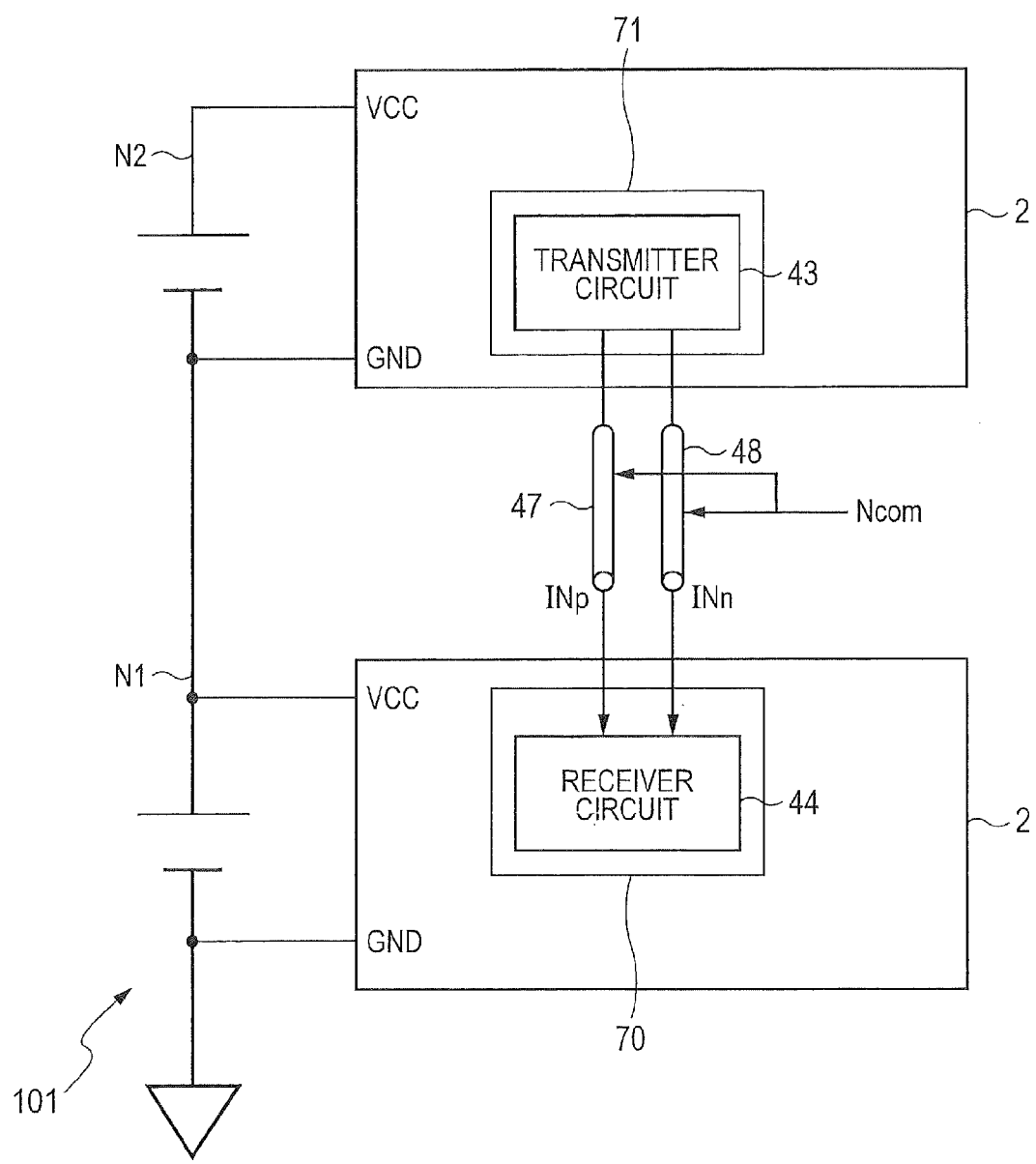
FIG. 4 is another diagram illustrating how the transmitter circuit and the receiver circuit are coupled in the communication function section included in the battery device shown in FIG. 1.
Figure 10:
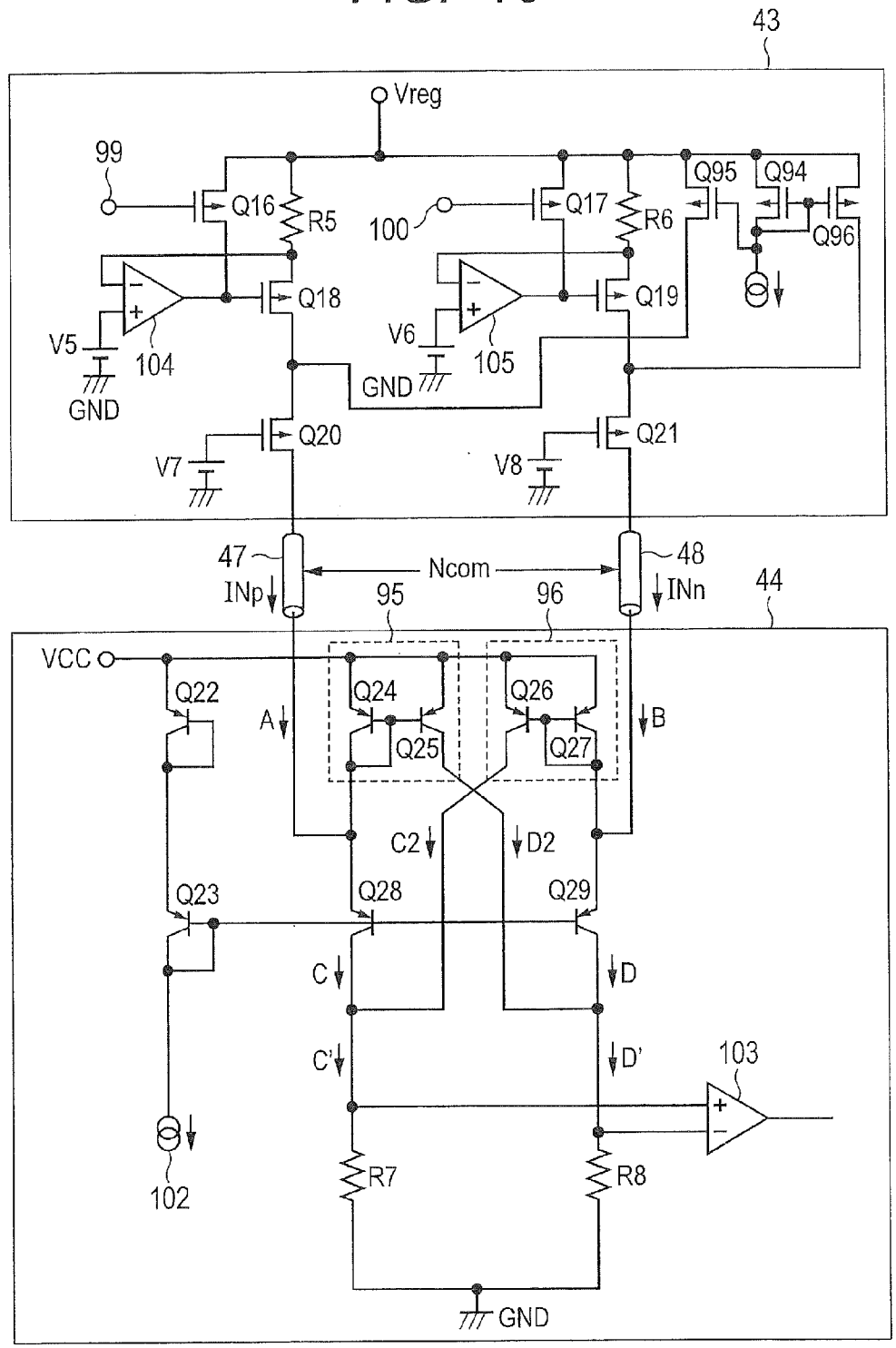
FIG. 10 is a circuit diagram illustrating an exemplary configuration of the transmitter circuit and receiver circuit shown in FIG. 4.

FIG. 10 shows an exemplary configuration of the transmitter circuit 43 and receiver circuit 44 shown in FIG. 4.

The transmitter circuit 43 is configured as described below.

A resistor R5 and p-channel MOS transistors Q18, Q20 are series-coupled to each other. The drain electrode of the p-channel MOS transistor Q20 is coupled to the transmission path 47. A reference voltage V7 is supplied to the gate electrode of the p-channel MOS transistor Q20 so that a predefined voltage drop occurs between the drain and source electrodes of the p-channel MOS transistor Q20 to prevent a high voltage from being applied to the receiver circuit 44 through the transmission path 47. A comparator 104 is provided to compare the potential at the source electrode of the p-channel MOS transistor Q18 to a reference voltage V5. The output signal of the comparator 104 is transmitted to the gate electrode of the p-channel MOS transistor Q18. A p-channel MOS transistor Q16 is disposed between the gate electrode of the p-channel MOS transistor Q18 and a low voltage Vreg. Transmitted data is conveyed to the gate electrode of the p-channel MOS transistor Q16 through an input terminal 99. In response to the transmitted data, the current INp provided by the first signal flows in the transmission path 47. A current mirror circuit (p-channel MOS transistors Q94, Q95) is coupled to the source of the p-channel MOS transistor Q20 to ensure that the source current of the p-channel MOS transistor Q20 is not completely 0 (zero).

A resistor R6 and p-channel MOS transistors Q19, Q21 are series-coupled to each other. The drain electrode of the p-channel MOS transistor Q21 is coupled to the transmission path 48. A reference voltage V8 is supplied to the gate electrode of the p-channel MOS transistor Q21 so that a predefined voltage drop occurs between the drain and source electrodes of the p-channel MOS transistor Q21 to prevent a high voltage from being applied to the receiver circuit 44 through the transmission path 48. A comparator 105 is provided to compare the potential at the source electrode of the p-channel MOS transistor Q19 to a reference voltage V6. The output signal of the comparator 105 is transmitted to the gate electrode of the p-channel MOS transistor Q19. A p-channel MOS transistor Q17 is disposed between the gate electrode of the p-channel MOS transistor Q19 and a low voltage Vreg. Transmitted data is conveyed to the gate electrode of the p-channel MOS transistor Q17 through an input terminal 100. In response to the transmitted data, the current INn provided by the second signal flows in the transmission path 48. A current mirror circuit (p-channel MOS transistors Q94, Q96) is coupled to the source of the p-channel MOS transistor Q21 to ensure that the source current of the p-channel MOS transistor Q21 is not completely 0 (zero).

The receiver circuit 44 is configured as described below.

The receiver circuit 44 includes bipolar transistors Q22 to Q29, resistors R7, R8, and a comparator 103. The bipolar transistors Q22 to Q29 are of a pnp type. The collector electrodes of the bipolar transistors Q28, Q29 are coupled to the ground GND through the resistors R7, R8, respectively. A cascode input circuit is employed to prevent a signal transmission rate from being decreased by parasitic capacitance. More specifically, the emitter electrode of the bipolar transistor Q28 is coupled to the transmission path 47 in order to acquire the first signal, whereas the emitter electrode of the bipolar transistor Q29 is coupled to the transmission path 48 in order to acquire the second signal. The bipolar transistor Q28 functions as a current buffer for acquiring the first signal. The bipolar transistor Q29 functions as a current buffer for acquiring the second signal. A predetermined bias voltage is supplied to the base electrode of each bipolar transistor Q28, Q29. This bias voltage is formed by the bipolar transistors Q22, Q23, which are series-coupled between the power supply voltage VCC and a constant current source 102. The bipolar transistors Q22, Q23 function as a diode as their collector electrode and base electrode are coupled together. The comparator 103 compares the potential at a series-coupled node between the resistor R7 and the bipolar transistor Q28 to the potential at a series-coupled node between the resistor R8 and the bipolar transistor Q29. The result of the comparison made by the comparator 103 is used as a received signal that is received by the receiver circuit 44 during differential communication.

As is the case with the receiver circuit 42 shown in FIG. 9, the receiver circuit 44 includes the first compensation circuit 95 and the second compensation circuit 96, which compensate for the attenuation of a current when common mode noise is superimposed on the first signal and on the second signal.

The first compensation circuit 95 is used to compensate for the attenuation of the first signal by detecting a portion of the first signal transmitted through the transmission path 47 that is beyond a predetermined input range and adding the detected portion to the second signal. The first compensation circuit 95 includes the bipolar transistor Q24, which is cascade-coupled to the bipolar transistor Q28, and the bipolar transistor Q25, which is current-mirror coupled to the bipolar transistor Q24. When a current flowing in a direction opposite to the direction of the current INp provided by the first signal flows in the bipolar transistor Q24 due to the common mode noise superimposed on the first signal flowing in the transmission path 47, a corresponding current flows in the bipolar transistor Q25. This current flows to the ground GND through the resistor R8 and is added to the second signal, which is to be transmitted to the comparator 103.

The second compensation circuit 96 is used to compensate for the attenuation of the first signal by detecting a portion of the second signal transmitted through the transmission path 48 that is beyond a predetermined input range and adding the detected portion to the first signal. The second compensation circuit 96 includes the bipolar transistor Q27, which is cascade-coupled to the bipolar transistor Q29, and the bipolar transistor Q26, which is current-mirror coupled to the bipolar transistor Q27. When a current flowing in a direction opposite to the direction of the second signal flows in the bipolar transistor Q27 due to the common mode noise superimposed on the second signal flowing in the transmission path 48, a corresponding current flows in the bipolar transistor Q26. This current flows to the ground GND through the resistor R7 and is added to the first signal, which is to be input to the comparator 103.

Operations performed when common mode noise Ncom is superimposed on signals in the transmission paths 47, 48 will now be described.

For the sake of explanation, it is assumed that a current A flows to an end of the transmission path 47 toward the receiver circuit 44, and that a current B flows to an end of the transmission path 48 toward the receiver circuit 44, and further that a current C flows to the collector electrode side of the bipolar transistor Q28, and still further that a current D flows to the collector electrode side of the bipolar transistor Q29. It is also assumed that a current C' flows in a path from a joint between the collector electrode of the bipolar transistor Q28 and the collector electrode of the bipolar transistor Q26 to the resistor R7, and that a current D' flows in a path from a joint between the collector electrode of the bipolar transistor Q29 and the collector electrode of the bipolar transistor Q25 to the resistor R8. It is still also assumed that a current D2 flows to the collector electrode of the bipolar transistor Q25, and that a current C2 flows to the collector electrode of the bipolar transistor Q26.

As is the case with the receiver circuit 42 shown in FIG. 9, the receiver circuit 44 shown in FIG. 10 includes the first compensation circuit 95 and the second compensation circuit 96. Therefore, even when the input current is below the reference level, a current is allowed to flow in the bipolar transistors Q24, Q27. This makes it possible to compensate for the attenuation of the current when common mode noise is superimposed on the first signal and on the second signal. In other words, even when the input current is below the reference level, a current flows in the bipolar transistor Q24 so that the corresponding current D2 flowing in the bipolar transistor Q25 is added to the current D flowing in the bipolar transistor Q29. Hence, the current D' is the sum of the current D and the attenuation of the current INp. Similarly, even when the input current is below the reference level, a current flows in the bipolar transistor Q27 so that the corresponding current C2 flowing in the bipolar transistor Q26 is added to the current C flowing in the bipolar transistor Q28. Hence, the current C' is the sum of the current C and the attenuation of the current INn. As a result, the difference between the current C' and the current D' has a good signal level because the attenuation caused by common mode noise is compensated for.

An operational advantage provided by the second embodiment is described below.

The receiver circuit 44 includes the first compensation circuit 95 and the second compensation circuit 96, which compensate for the attenuation of a current when common mode noise is superimposed on the first signal and on the second signal. Therefore, the receiver circuit 44 can compensate for the attenuation caused by the common mode noise and obtain a good signal level, as is the case with the receiver circuit 42 shown in FIG. 9.

Third Embodiment

Figure 11:
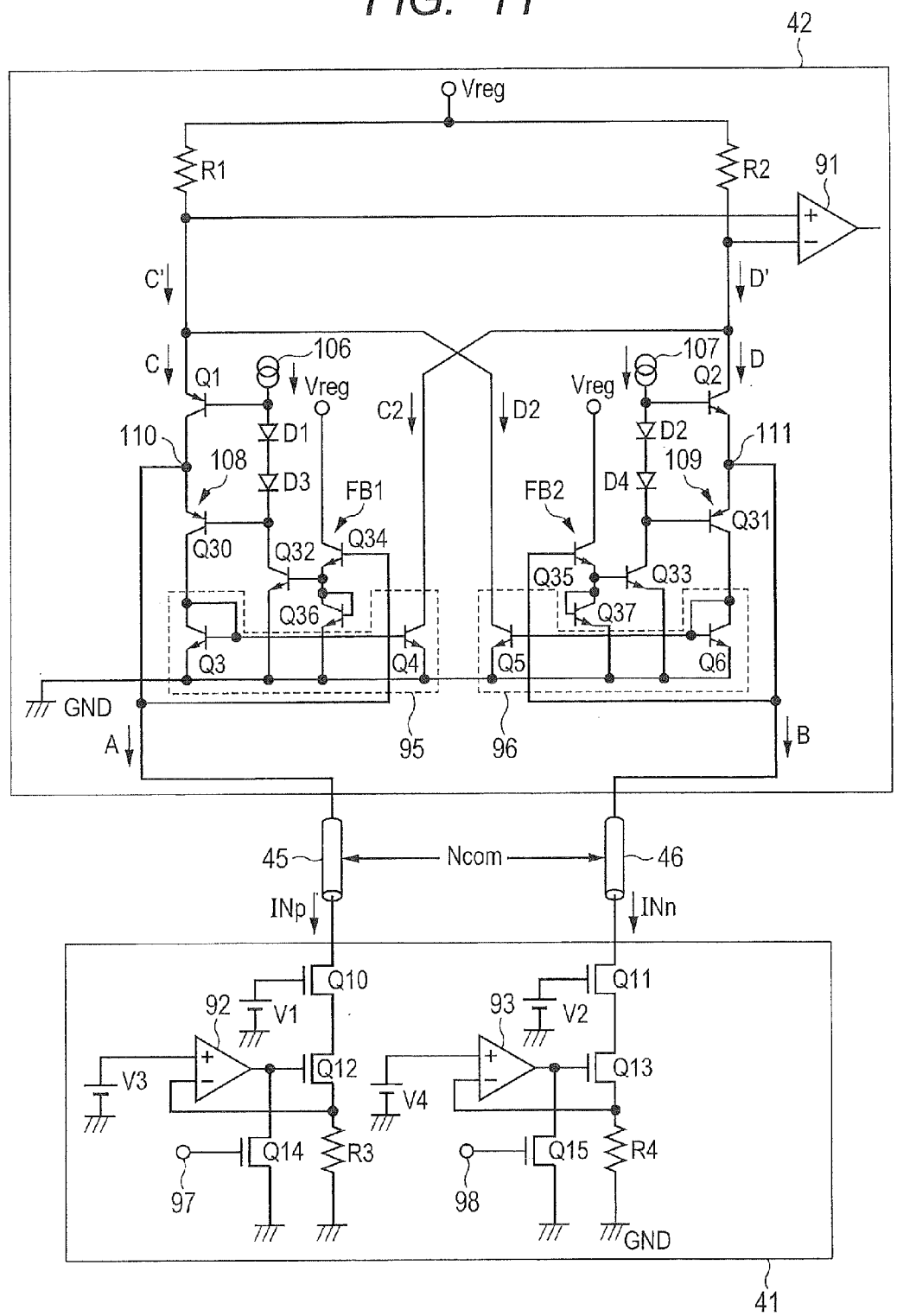
FIG. 11 is a circuit diagram illustrating another exemplary configuration of the receiver circuit shown in FIG. 3.

FIG. 11 shows another exemplary configuration of the receiver circuit 42 shown in FIG. 3.

A great difference between the receiver circuit 42 shown in FIG. 11 and the receiver circuit shown in FIG. 9 is that the former includes a first impedance adjustment circuit 108 and a second impedance adjustment circuit 109. The first impedance adjustment circuit 108 is used to adjust the input impedance of the receiver circuit 42 as viewed from the first transmission path 45. The second impedance adjustment circuit 109 is used to adjust the input impedance of the receiver circuit 42 as viewed from the second transmission path 46. Further, in the receiver circuit 42 shown in FIG. 11, feedback is applied to the base electrodes of the bipolar transistors Q1, Q2.

The first impedance adjustment circuit 108 includes a bipolar transistor Q30 and a first feedback circuit FB1. The bipolar transistor Q30 is of a pnp type and disposed between the bipolar transistor Q1 and the bipolar transistor Q3. The first feedback circuit FB1 controls the operation of the bipolar transistor Q30 in accordance with the voltage at a series-coupled node 110.

The first feedback circuit FB1 includes bipolar transistors Q32, Q34, Q36. Each of the bipolar transistors Q32, Q34, Q36 is of an npn type. The emitter electrode of the bipolar transistor Q34 is coupled to the ground GND through the diode-coupled bipolar transistor Q36. The constant voltage Vreg is supplied to the collector electrode of the bipolar transistor Q34. The voltage at the series-coupled node 110 between the bipolar transistor Q1 and the bipolar transistor Q30 is supplied to the base electrode of the bipolar transistor Q34. The voltage at the emitter electrode of the bipolar transistor Q34 is transmitted to the base electrode of the bipolar transistor Q32. The collector electrode of the bipolar transistor Q32 is coupled to a constant current source 106 through diodes D1, D3, which are mutually series-coupled. The emitter electrode of the bipolar transistor Q32 is coupled to the ground GND. The voltage at the collector electrode of the bipolar transistor Q32 is transmitted to the base electrode of the bipolar transistor Q30. As the above-described configuration is employed, the bipolar transistor Q30 and the bipolar transistor Q1 are feedback controlled in accordance with the level of the voltage at the series-coupled node 110 between the bipolar transistor Q1 and the bipolar transistor Q30 to reduce the input impedance of the receiver circuit 42 as viewed from the first transmission path 45. Hence, the charge/discharge time for the parasitic capacitance near the series-coupled node 110 between the bipolar transistor Q1 and the bipolar transistor Q30 can be reduced. This makes it possible to increase the rate of signal transmission through the transmission path 45.

The second impedance adjustment circuit 109 includes a bipolar transistor Q31 and a second feedback circuit FB2. The bipolar transistor Q31 is of a pnp type and disposed between the bipolar transistor Q2 and the bipolar transistor Q6. The second feedback circuit FB2 controls the operation of the bipolar transistor Q31 in accordance with the voltage at a series-coupled node 111.

The second feedback circuit FB2 includes bipolar transistors Q33, Q35, Q37. Each of the bipolar transistors Q33, Q35, Q37 is of an npn type. The emitter electrode of the bipolar transistor Q35 is coupled to the ground GND through the diode-coupled bipolar transistor Q37. The constant voltage Vreg is supplied to the collector electrode of the bipolar transistor Q35. The voltage at the series-coupled node 111 between the bipolar transistor Q2 and the bipolar transistor Q31 is supplied to the base electrode of the bipolar transistor Q35. The voltage at the emitter electrode of the bipolar transistor Q35 is transmitted to the base electrode of the bipolar transistor Q33. The collector electrode of the bipolar transistor Q33 is coupled to a constant current source 107 through diodes D2, D4, which are mutually series-coupled. The emitter electrode of the bipolar transistor Q33 is coupled to the ground GND. The voltage at the collector electrode of the bipolar transistor Q33 is transmitted to the base electrode of the bipolar transistor Q31. As the above-described configuration is employed, the bipolar transistor Q31 is feedback controlled in accordance with the level of the voltage at the series-coupled node 111 between the bipolar transistor Q2 and the bipolar transistor Q31 to reduce the input impedance of the receiver circuit 42 as viewed from the transmission path 46. Hence, the charge/discharge time for the parasitic capacitance near the series-coupled node ill between the bipolar transistor Q2 and the bipolar transistor Q31 can be reduced. This makes it possible to increase the rate of signal transmission through the transmission path 46.

Operational advantages provided by the third embodiment are described below.

(1) The receiver circuit 42 includes the first compensation circuit 95 and the second compensation circuit 96, which compensate for the attenuation of a current when common mode noise is superimposed on the first signal and on the second signal. Therefore, the receiver circuit 42 can compensate for the attenuation caused by the common mode noise and obtain a good signal level, as is the case with the receiver circuit shown in FIG. 9.

(2) The first impedance adjustment circuit 108 reduces the input impedance of the receiver circuit 42 as viewed from the transmission path 45. The second impedance adjustment circuit 109 reduces the input impedance of the receiver circuit 42 as viewed from the transmission path 46. As the input impedance is reduced in the above-described manner, the charge/discharge time for the parasitic capacitance can be reduced. This makes it possible to increase the rate of signal transmission.

Fourth Embodiment

Figure 12:
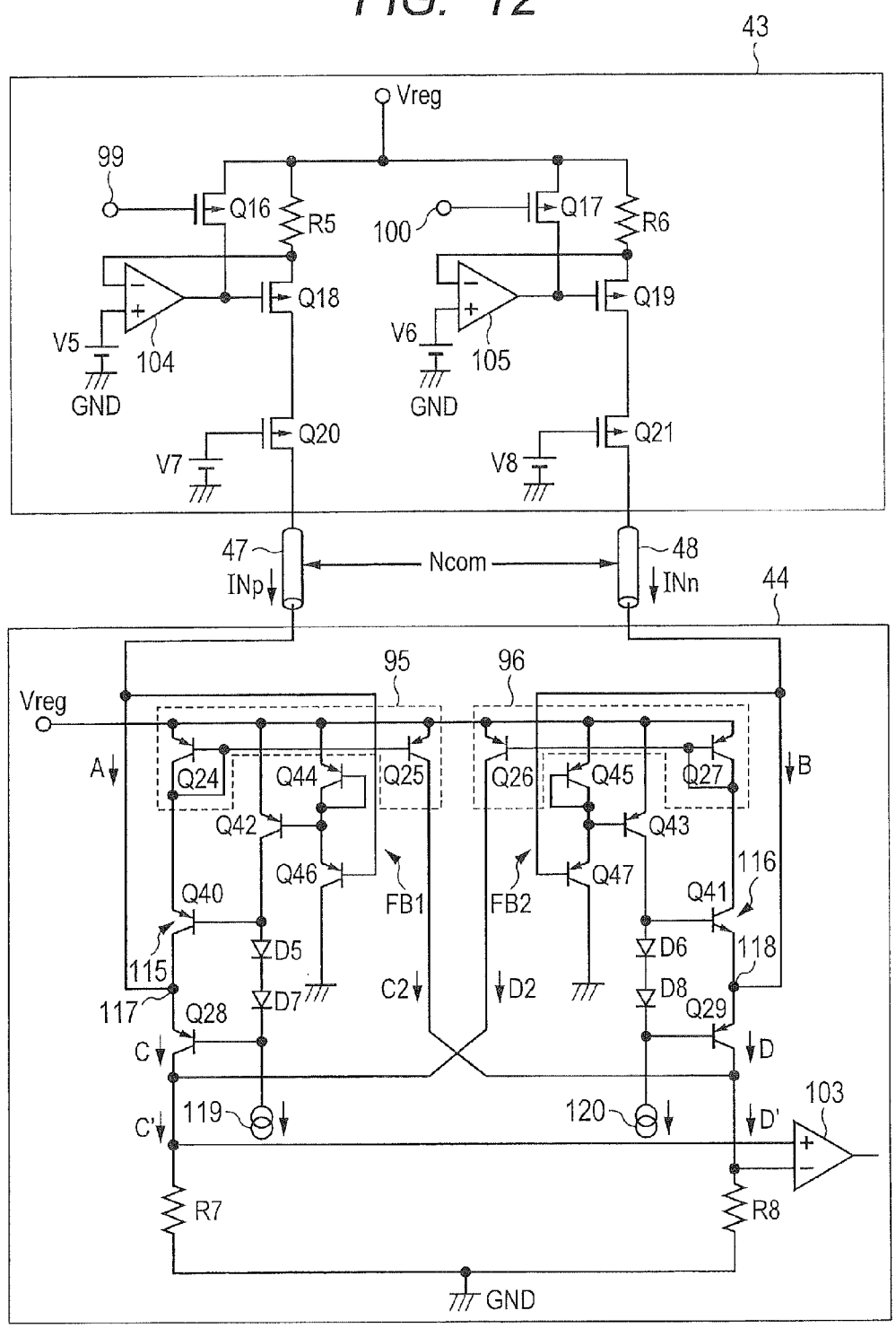
FIG. 12 is a circuit diagram illustrating another exemplary configuration of the receiver circuit shown in FIG. 4.

FIG. 12 shows another exemplary configuration of the receiver circuit 44 shown in FIG. 4.

A great difference between the receiver circuit 44 shown in FIG. 12 and the receiver circuit shown in FIG. 10 is that the former includes a first impedance adjustment circuit 115 and a second impedance adjustment circuit 116. The first impedance adjustment circuit 115 is used to adjust the input impedance of the receiver circuit 44 as viewed from the first transmission path 47. The second impedance adjustment circuit 116 is used to adjust the input impedance of the receiver circuit 44 as viewed from the second transmission path 48.

The first impedance adjustment circuit 115 includes a bipolar transistor Q40 and a first feedback circuit FB1. The bipolar transistor Q40 is of an npn type and disposed between the bipolar transistor Q28 and the bipolar transistor Q24. The first feedback circuit FB1 controls the operation of the bipolar transistor Q40. The first feedback circuit FB1 controls the operation of the bipolar transistor Q40 in accordance with the voltage at a series-coupled node 117 between the bipolar transistor Q28 and the bipolar transistor Q40.

The first feedback circuit FB1 includes bipolar transistors Q42, Q44, Q46. Each of the bipolar transistors Q42, Q44, Q46 is of a pnp type. The emitter electrode of the bipolar transistor Q46 is coupled to the constant voltage Vreg terminal through the diode-coupled bipolar transistor Q44. The collector electrode of the bipolar transistor Q46 is coupled to the ground GND. The voltage at the series-coupled node 117 between the bipolar transistor Q28 and the bipolar transistor Q40 is supplied to the base electrode of the bipolar transistor Q46. The voltage at the emitter electrode of the bipolar transistor Q46 is transmitted to the base electrode of the bipolar transistor Q42. The collector electrode of the bipolar transistor Q42 is coupled to a constant current source 119 through diodes D5, D7, which are mutually series-coupled. The emitter electrode of the bipolar transistor Q42 is coupled to the constant voltage Vreg terminal. The voltage at the collector electrode of the bipolar transistor Q42 is transmitted to the base electrode of the bipolar transistor Q40. As the above-described configuration is employed, the bipolar transistor Q40 is feedback controlled in accordance with the level of the voltage at the series-coupled node 117 between the bipolar transistor Q28 and the bipolar transistor Q40 to reduce the input impedance of the receiver circuit 44 as viewed from the transmission path 47. Hence, the charge/discharge time for the parasitic capacitance near the series-coupled node 117 between the bipolar transistor Q28 and the bipolar transistor Q40 can be reduced. This makes it possible to increase the rate of signal transmission through the transmission path 47.

The second impedance adjustment circuit 116 includes a bipolar transistor Q41 and a second feedback circuit FB2. The bipolar transistor Q41 is of an npn type and disposed between the bipolar transistor Q29 and the bipolar transistor Q27. The second feedback circuit FB2 controls the operation of the bipolar transistor Q41. The second feedback circuit FB2 controls the operation of the bipolar transistor Q41 in accordance with the voltage at a series-coupled node 118 between the bipolar transistor Q29 and the bipolar transistor Q41.

The second feedback circuit FB2 includes bipolar transistors Q43, Q45, Q47. Each of the bipolar transistors Q43, Q45, Q47 is of a pnp type. The emitter electrode of the bipolar transistor Q47 is coupled to the constant voltage Vreg terminal through the diode-coupled bipolar transistor Q45. The collector electrode of the bipolar transistor Q47 is coupled to the ground GND. The voltage at the series-coupled node 118 between the bipolar transistor Q29 and the bipolar transistor Q41 is supplied to the base electrode of the bipolar transistor Q47. The voltage at the emitter electrode of the bipolar transistor Q47 is transmitted to the base electrode of the bipolar transistor Q43. The collector electrode of the bipolar transistor Q43 is coupled to a constant current source 120 through diodes D6, D8, which are mutually series-coupled. The emitter electrode of the bipolar transistor Q43 is coupled to the constant voltage Vreg terminal. The voltage at the collector electrode of the bipolar transistor Q43 is transmitted to the base electrode of the bipolar transistor Q41. As the above-described configuration is employed, the bipolar transistor Q41 is feedback controlled in accordance with the level of the voltage at the series-coupled node 118 between the bipolar transistor Q29 and the bipolar transistor Q41 to reduce the input impedance of the receiver circuit 44 as viewed from the transmission path 48. Hence, the charge/discharge time for the parasitic capacitance near the series-coupled node 118 between the bipolar transistor Q29 and the bipolar transistor Q41 can be reduced. This makes it possible to increase the rate of signal transmission through the transmission path 48.

Operational advantages provided by the fourth embodiment are described below.

(1) The receiver circuit 44 includes the first compensation circuit 95 and the second compensation circuit 96, which compensate for the attenuation of a current when common mode noise is superimposed on the first signal and on the second signal. Therefore, the receiver circuit 44 can compensate for the attenuation caused by the common mode noise and obtain a good signal level, as is the case with the receiver circuit shown in FIG. 10.

(2) The first impedance adjustment circuit 115 reduces the input impedance of the receiver circuit 44 as viewed from the transmission path 47. The second impedance adjustment circuit 116 reduces the input impedance of the receiver circuit 44 as viewed from the transmission path 48. As the input impedance is reduced in the above-described manner, the charge/discharge time for the parasitic capacitance can be reduced. This makes it possible to increase the rate of signal transmission.

Fifth Embodiment

Figure 13:
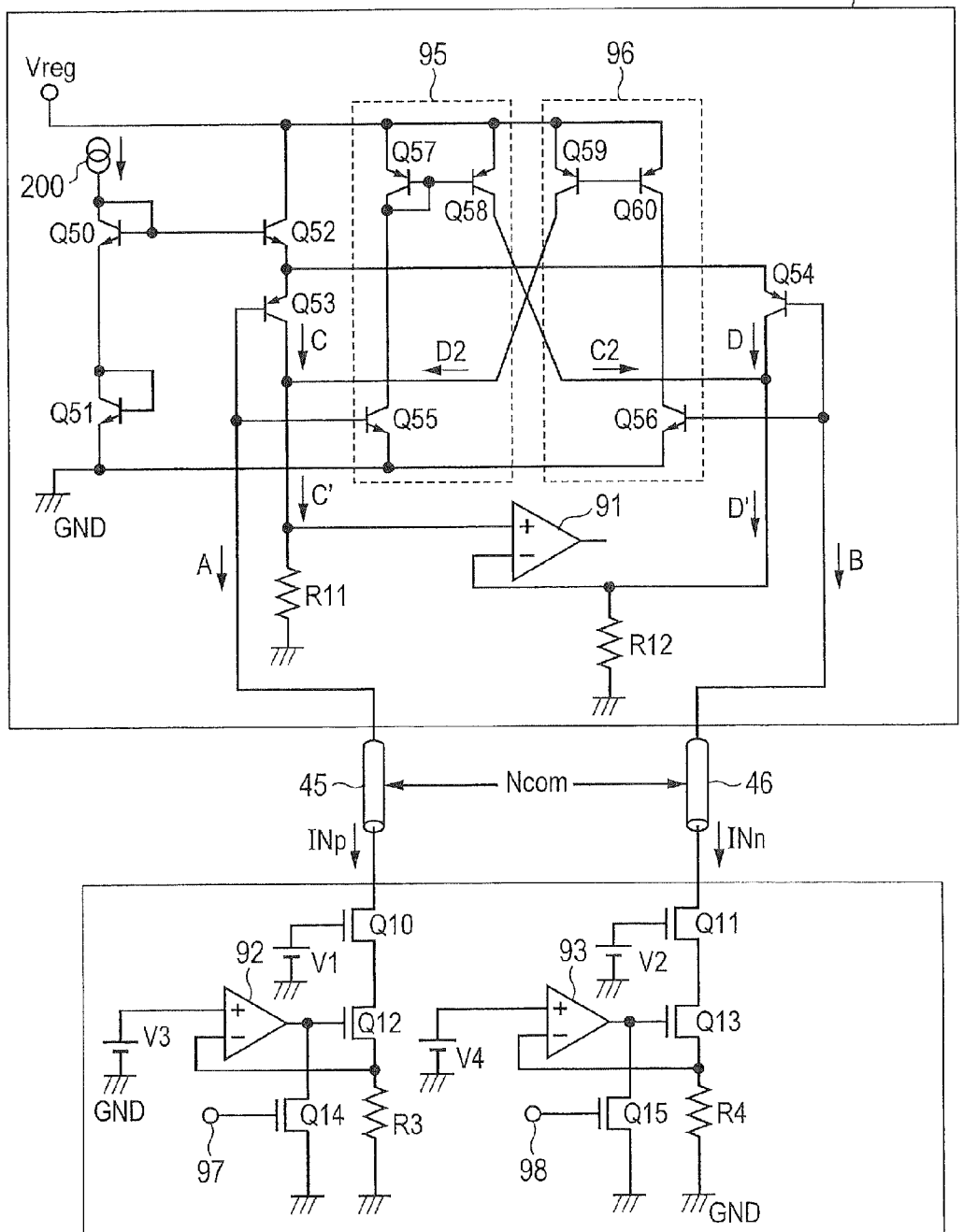
FIG. 13 is a circuit diagram illustrating another exemplary configuration of the receiver circuit shown in FIG. 3.

FIG. 13 shows another exemplary configuration of the receiver circuit 42 shown in FIG. 3.

The receiver circuit 42 includes bipolar transistors Q50 to Q60, resistors R11, R12, and the comparator 91. The bipolar transistors Q50, Q51, Q52, Q55, Q56 are of an npn type. The bipolar transistors Q53, Q54, Q57, Q58, Q59, Q60 are of a pnp type.

The transmission path 45 is coupled to the base electrode of the bipolar transistor Q53 so that the current A flows through the base electrode of the bipolar transistor Q53. The transmission path 46 is coupled to the base electrode of the bipolar transistor Q54 so that the current B flows through the base electrode of the bipolar transistor Q54. The emitter electrode of the bipolar transistor Q53 and the emitter electrode of the bipolar transistor Q54 are commonly coupled to the bipolar transistor Q52. The constant voltage Vreg is supplied to the collector electrode of the bipolar transistor Q52. A predetermined bias voltage is supplied to the base electrode of the bipolar transistor Q52. This bias voltage is formed by the bipolar transistors Q50, Q51, which are coupled to a constant current source 200. The bipolar transistors Q50, Q51 are respectively diode-coupled. The collector electrode of the bipolar transistor Q53 is coupled to the ground GND through the resistor R11. The collector electrode of the bipolar transistor Q54 is coupled to the ground GND through the resistor R12. The comparator 91 compares the terminal voltage of the resistor R11 to the terminal voltage of the resistor R12. The result of the comparison made by the comparator 91 is used as a received signal that is received by the receiver circuit 42 during differential communication.

Further, the receiver circuit 42 includes the first compensation circuit 95 and the second compensation circuit 96, which compensate for the attenuation of a current when common mode noise is superimposed on the first signal in the transmission path 45 and on the second signal in the transmission path 46.

The first compensation circuit 95 includes the bipolar transistors Q55, Q57, Q58. The bipolar transistor Q55 amplifies a current that flows in a direction opposite to the direction in which the first signal flows due to the common mode noise superimposed on the first signal in the transmission path 45. The base electrode of the bipolar transistor Q55 is coupled to the transmission path 45. The emitter electrode of the bipolar transistor Q56 is coupled to the ground GND. The bipolar transistor Q57 is coupled to the collector electrode of the bipolar transistor Q55. The bipolar transistor Q57 is handled as a load on the bipolar transistor Q55. The bipolar transistor Q58 is current-mirror coupled to the bipolar transistor Q57. A current flowing to the collector electrode of the bipolar transistor Q58 is added to the second signal, which is to be input to the comparator 91. In other words, the current D' flowing in the resistor R12 is the sum of the current D and the current C2.

The second compensation circuit 96 includes the bipolar transistors Q56, Q59, Q60. The bipolar transistor Q56 amplifies a current that flows in a direction opposite to the direction in which the second signal flows due to the common mode noise superimposed on the second signal in the transmission path 46. The base electrode of the bipolar transistor Q56 is coupled to the transmission path 45. The emitter electrode of the bipolar transistor Q56 is coupled to the ground GND. The bipolar transistor Q60 is coupled to the collector electrode of the bipolar transistor Q56. The bipolar transistor Q60 is handled as a load on the bipolar transistor Q56. The bipolar transistor Q59 is current-mirror coupled to the bipolar transistor Q60. A current flowing to the collector electrode of the bipolar transistor Q59 is added to the second signal, which is to be input to the comparator 91. In other words, the current D2 is added to the current C so that the current C' flowing in the resistor R11 is the sum of the current C and the current D2.

Operational advantages provided by the fifth embodiment are described below.

(1) The receiver circuit 42 includes the first compensation circuit 95 and the second compensation circuit 96, which compensate for the attenuation of a current when common mode noise is superimposed on the first signal and on the second signal. Therefore, the receiver circuit 42 can compensate for the attenuation caused by the common mode noise and obtain a good signal level, as is the case with the receiver circuit shown in FIG. 9.

(2) The collector current of the bipolar transistor Q53 (current C) is obtained by multiplying the base current of the bipolar transistor Q53 (current A) by the DC current amplification factor (hfe) of the bipolar transistor Q53. The collector current of the bipolar transistor Q54 (current D) is obtained by multiplying the base current of the bipolar transistor Q54 (current B) by the hfe of the bipolar transistor Q54. Even when the current INp in the transmission path 45 and the current INn in the transmission path 46 are small, an adequate signal current flows in the circuit as far as the current is amplified by the bipolar transistors Q53, Q54 after signal reception as described above. Consequently, the rate of transmission can be increased.

(3) In the first compensation circuit 95 and in the second compensation circuit 96, the current of the input signal is amplified by the bipolar transistors Q55, Q56, respectively. This current amplification is performed in response to the current amplification by the bipolar transistors Q53, Q54. Consequently, the attenuation of a current can be accurately compensated for when common mode noise is superimposed on the first signal and on the second signal.

Sixth Embodiment

Figure 14:
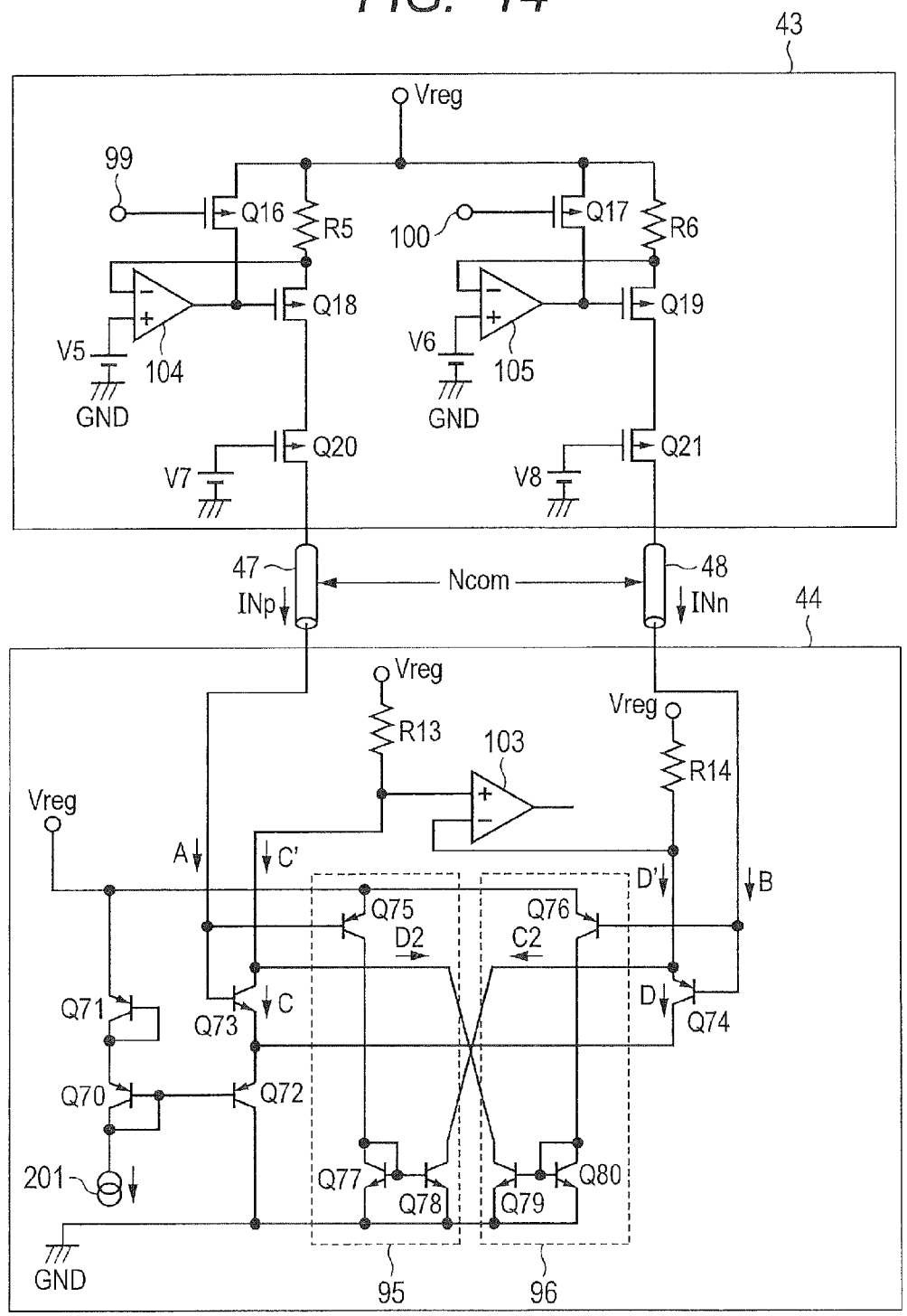
FIG. 14 is a circuit diagram illustrating another exemplary configuration of the receiver circuit shown in FIG. 4.

FIG. 14 shows another exemplary configuration of the receiver circuit 44 shown in FIG. 4.

The receiver circuit 44 includes bipolar transistors Q70 to Q80, resistors R13, R14, and the comparator 103. The bipolar transistors Q70, Q71, Q72, Q75, Q76 are of a pnp type. The bipolar transistors Q73, Q74, Q77, Q78, Q79, Q80 are of an npn type.

The transmission path 47 is coupled to the base electrode of the bipolar transistor Q73 so that the current A flows through the base electrode of the bipolar transistor Q73. The transmission path 48 is coupled to the base electrode of the bipolar transistor Q74 so that the current B flows through the base electrode of the bipolar transistor Q74. The emitter electrode of the bipolar transistor Q73 and the emitter electrode of the bipolar transistor Q74 are commonly coupled to the bipolar transistor Q72. The collector electrode of the bipolar transistor Q72 is coupled to the ground GND. A predetermined bias voltage is supplied to the base electrode of the bipolar transistor Q72. This bias voltage is formed by the bipolar transistors Q70, Q71, which are coupled to a constant current source 201. The bipolar transistors Q70, Q71 are respectively diode-coupled. The collector electrode of the bipolar transistor Q73 is coupled to the constant voltage Vreg terminal through the resistor R13. The collector electrode of the bipolar transistor Q74 is coupled to the constant voltage Vreg terminal through the resistor R14. The comparator 91 compares the collector voltage of the bipolar transistor Q73 to the collector voltage of the bipolar transistor Q74. The result of the comparison made by the comparator 91 is used as a received signal that is received by the receiver circuit 44 during differential communication.

Further, the receiver circuit 44 includes the first compensation circuit 95 and the second compensation circuit 96, which compensate for the attenuation of a current when common mode noise is superimposed on the first signal in the transmission path 47 and on the second signal in the transmission path 48.

The first compensation circuit 95 includes the bipolar transistors Q75, Q77, Q78. The bipolar transistor Q75 amplifies a current that flows in a direction opposite to the direction in which the first signal flows due to the common mode noise superimposed on the first signal in the transmission path 47. The base electrode of the bipolar transistor Q75 is coupled to the transmission path 47. The emitter electrode of the bipolar transistor Q75 is coupled to the constant voltage Vreg terminal. The bipolar transistor Q77 is coupled to the collector electrode of the bipolar transistor Q75. The bipolar transistor Q77 is handled as a load on the bipolar transistor Q75. The bipolar transistor Q78 is current-mirror coupled to the bipolar transistor Q77. A current flowing to the collector electrode of the bipolar transistor Q78 is added to the second signal, which is to be input to the comparator 91. In other words, the current (current D') flowing in the resistor R14 is the sum of the current D and the current C2.

The second compensation circuit 96 includes the bipolar transistors Q76, Q79, Q80. The bipolar transistor Q76 amplifies a current that flows in a direction opposite to the direction in which the second signal flows due to the common mode noise superimposed on the second signal in the transmission path 48. The base electrode of the bipolar transistor Q76 is coupled to the transmission path 48. The emitter electrode of the bipolar transistor Q76 is coupled to the constant voltage Vreg terminal. The bipolar transistor Q80 is coupled to the collector electrode of the bipolar transistor Q76. The bipolar transistor Q80 is handled as a load on the bipolar transistor Q76. The bipolar transistor Q79 is current-mirror coupled to the bipolar transistor Q80. A current flowing to the collector electrode of the bipolar transistor Q79 is added to the second signal, which is to be input to the comparator 103. In other words, the current (current C') flowing in the resistor R13 is the sum of the current C and the current D2.

Operational advantages provided by the sixth embodiment are described below.

(1) The receiver circuit 44 includes the first compensation circuit 95 and the second compensation circuit 96, which compensate for the attenuation of a current when common mode noise is superimposed on the first signal and on the second signal. Therefore, the receiver circuit 44 can compensate for the attenuation caused by the common mode noise and obtain a good signal level, as is the case with the receiver circuit shown in FIG. 10.

(2) The collector current of the bipolar transistor Q73 (current C) is obtained by multiplying the base current of the bipolar transistor Q73 (current A) by the hfe of the bipolar transistor Q73. The collector current of the bipolar transistor Q74 (current D) is obtained by multiplying the base current of the bipolar transistor Q74 (current B) by the hfe of the bipolar transistor Q74. Even when the current INp in the transmission path 47 and the current INn in the transmission path 48 are small, an adequate signal current flows in the circuit as far as the current is amplified by the bipolar transistors Q73, Q74 after signal reception as described above. Consequently, the rate of transmission can be increased.

(3) In the first compensation circuit 95 and in the second compensation circuit 96, the current of the input signal is amplified by the bipolar transistors Q75, Q76, respectively. This current amplification is performed in response to the current amplification by the bipolar transistors Q73, Q74. Consequently, the attenuation of a current can be accurately compensated for when common mode noise is superimposed on the first signal and on the second signal.

Seventh Embodiment

Figure 15:
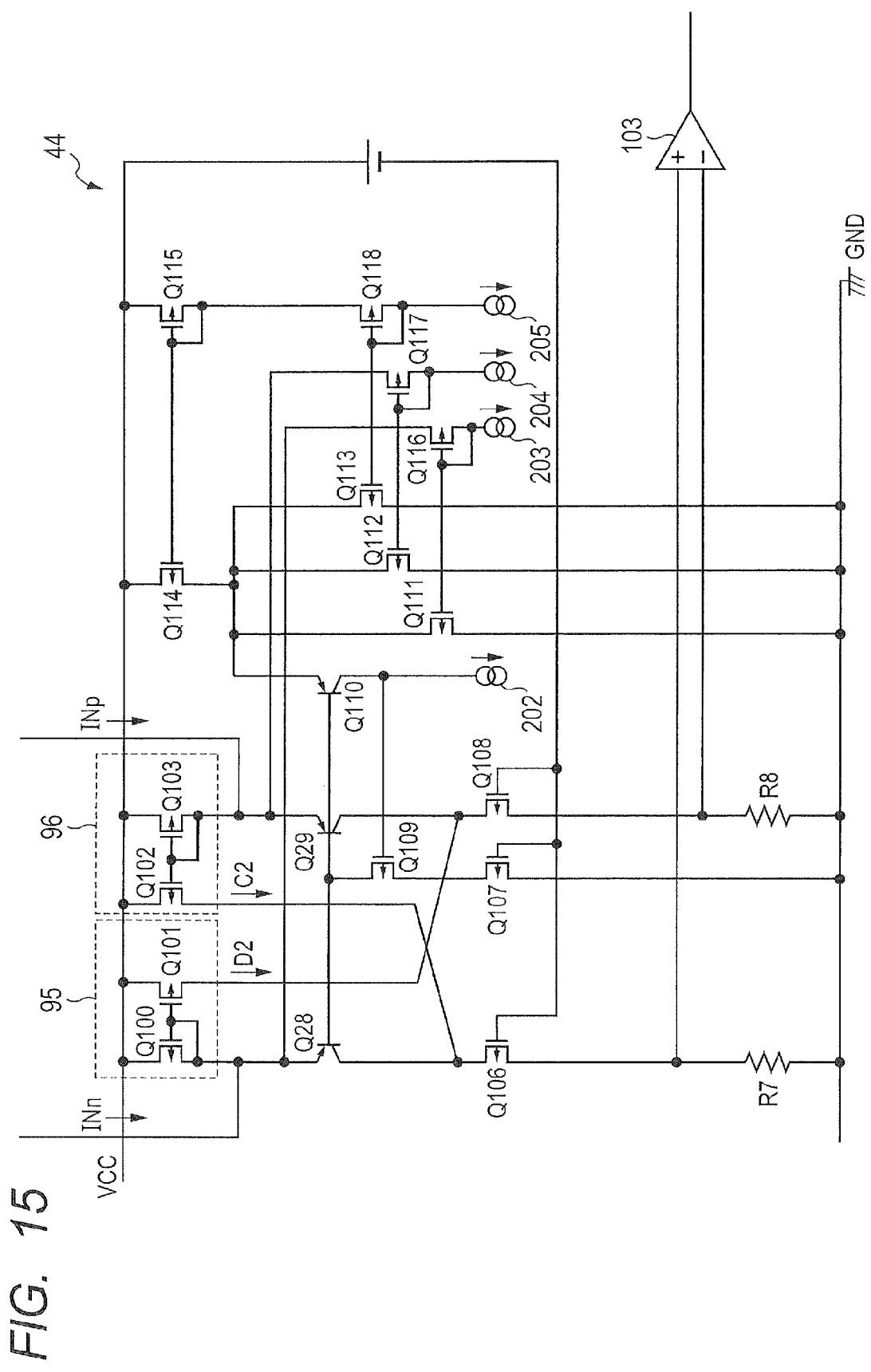
FIG. 15 is a circuit diagram illustrating another exemplary configuration of the receiver circuit shown in FIG. 10.

FIG. 15 shows another exemplary configuration of the receiver circuit 44 shown in FIG. 10. Elements identical with those shown in FIG. 10 are designated by the same reference numerals as the corresponding elements.

The speed of communication between the transmitter circuit 43 and the receiver circuit 44 can be increased by reducing the voltage amplitude of an input signal for the input stage of the receiver circuit 44. Studies conducted by the inventors of the present invention have revealed that when, in the receiver circuit 44 shown in FIG. 10, a transition occurs from a state where a current flows in the bipolar transistor Q24 to a state where a current flows in the bipolar transistor Q28, the voltage amplitude of the first signal is likely to increase due to the common mode noise Ncom. This also holds true for the second signal. When a transition occurs from a state where a current flows in the bipolar transistor Q27 to a state where a current flows in the bipolar transistor Q29, the voltage amplitude of the second signal is likely to increase.

To address the above problem, the receiver circuit 44 shown in FIG. 15 uses a method of feeding back the base voltage. The use of such a base voltage feedback method makes it possible to decrease the voltage amplitude of the input stage.

Referring to FIG. 15, the first compensation circuit 95 includes p-channel MOS transistors Q100, Q101, whereas the second compensation circuit 95 includes p-channel MOS transistors Q102, Q103. Pnp bipolar transistor Q110, P-channel MOS transistors Q113, Q115, Q118 are included so that the emitter voltage of the pnp bipolar transistors Q28, Q29 is set or fixed to the voltage at the drain electrode of the p-channel MOS transistor Q115 when no current flows in the p-channel MOS transistors Q100, Q103. No high voltage is applied to the pnp bipolar transistors Q28, Q29 because p-channel MOS transistors Q106, Q107, Q108 are included. The reference numerals 202 to 205 denote a constant current source.

P-channel MOS transistors Q112, Q111, Q116, Q117 are included to stabilize a communication current by feeding back the base voltage. In other words, the common mode noise is superimposed so that the potential of the emitter electrode of the pnp bipolar transistor Q110 is set or fixed to the lower potential of the voltages at the emitter electrodes of pnp bipolar transistors Q28, Q29 when the communication current flows in the p-channel MOS transistor Q100 or Q103. The above-described configuration is a base voltage feedback configuration.

Even when a current flows in the p-channel MOS transistor Q100 or Q103 and the drain voltage of the p-channel MOS transistor Q100 or Q103 is decreased, the use of the above-described configuration ensures that the base potentials of the pnp bipolar transistors Q28, Q29 decrease with a decrease in the drain voltage of the p-channel MOS transistor Q100 or Q103. Consequently, the voltage amplitude of an input terminal can be reduced to increase the speed of communication.

Even when the base voltage is fed back as described above, the common mode noise may cause the attenuation of a current. However, as the first compensation circuit 95 and the second compensation circuit 96 are included, the above-described configuration can compensate for the attenuation caused by the common mode noise and obtain a good signal level, as is the case with the configuration shown in FIG. 10.

However, when the above-described feedback configuration is employed, the circuit configuration shown in FIG. 10 may decrease the amount of signal attenuation. For example, the common mode noise may cause a current to flow in the p-channel MOS transistor Q100, thereby decreasing the base potential of the pnp bipolar transistor Q29. The base-emitter voltage of the pnp bipolar transistors Q29 and the gate-source voltage of the p-channel MOS transistor Q103 then increase to increase the current of the pnp bipolar transistor Q29 and the p-channel MOS transistor Q103, thereby causing a current to flow in such a manner as to suppress the attenuation of a signal. Hence, the amount of signal attenuation decreases. As such being the case, the current mirror ratios of the p-channel MOS transistors Q100, Q101, Q102, Q103 are set to appropriate values in order to perform proper compensation setup for the amount of signal attenuation.

The source voltage of the p-channel MOS transistor Q109 can be effectively stabilized at the time of current changeover by coupling the source voltage of the p-channel MOS transistor Q109 to the bases of the pnp bipolar transistors Q28, Q29. Noise can be offset more easily than when the source voltage of the p-channel MOS transistor Q109 is not coupled to the bases of the pnp bipolar transistors Q28, Q29.

A comparison between the feedback method shown in FIG. 15 and the feedback method shown in FIG. 12 reveals that when the frequency of common mode noise is low, the feedback method shown in FIG. 15 works more effectively than the feedback method shown in FIG. 12 even if a feedback band frequency is low.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

The reference level Dlange for a current can be set to any value other than 0 amperes.

What is claimed is:

1. A communication circuit comprising:
a receiver circuit that provides differential communication by using a first transmission path and a second transmission path, the first transmission path being used to transmit a first signal, the second transmission path being used to transmit a second signal, the second signal being in opposite phase to the first signal;
wherein the receiver circuit includes
a compensation circuit that compensates for an attenuation of a current when common mode noise is superimposed on the first signal and on the second signal,
wherein the compensation circuit includes
a first compensation circuit, and
a second compensation circuit,
wherein the first compensation circuit detects an electric current attenuation of the first signal when the common mode noise is superimposed on the first signal, and compensates for the attenuation of the first signal by adding the detected electric current attenuation to the second signal, and
wherein the second compensation circuit detects an electric current attenuation of the second signal when the common mode noise is superimposed on the second signal, and compensates for the attenuation of the second signal by adding the detected electric current attenuation to the first signal.

2. The communication circuit according to claim 1, wherein the receiver circuit further includes:
a first transistor that acquires the first signal;
a second transistor that acquires the second signal; and
a comparator that compares the first signal, which is transmitted through the first transistor, to the second signal, which is transmitted through the second transistor.

3. The communication circuit according to claim 2, wherein the first compensation circuit includes:
a third transistor that is cascade-coupled to the first transistor; and
a fourth transistor that is current-mirror coupled to the third transistor to acquire the current to be added to the second signal; and
wherein the second compensation circuit includes:
a fifth transistor that is cascade-coupled to the second transistor, and
a sixth transistor that is current-mirror coupled to the fifth transistor to acquire the current to be added to the first signal.

4. The communication circuit according to claim 3, wherein the fourth transistor is coupled so that a current flowing in the fourth transistor is added to the second signal before the comparator makes a comparison; and
wherein the sixth transistor is coupled so that a current flowing in the sixth transistor is added to the first signal before the comparator makes a comparison.

5. The communication circuit according to claim 4, further comprising:
a first impedance adjustment circuit that adjusts an input impedance of the receiver circuit as viewed from the first transmission path, and
a second impedance adjustment circuit that adjusts the input impedance of the receiver circuit as viewed from the second transmission path.

6. The communication circuit according to claim 5, wherein the first impedance adjustment circuit includes:
a seventh transistor that is disposed between the first transistor and the second transistor; and
a first feedback circuit that controls an operation of the seventh transistor in accordance with a voltage at a series-coupled node between the first transistor and the seventh transistor; and wherein the second impedance adjustment circuit includes an eighth transistor that is disposed between the fourth transistor and the fifth transistor, and a second feedback circuit that controls an operation of the eighth transistor in accordance with a voltage at a series-coupled node between the fourth transistor and the eighth transistor.

7. The communication circuit according to claim 1, wherein the receiver circuit includes:

a ninth transistor that amplifies the first signal;

a tenth transistor that amplifies the second signal, and a comparator that compares an output of the ninth transistor to an output of the tenth transistor.

8. The communication circuit according to claim 7, wherein the first compensation circuit includes:

an eleventh transistor that amplifies a current flowing in a direction opposite to a direction in which the first signal flows due to the common mode noise superimposed on the first signal;

a twelfth transistor (Q57) that forms a load on the eleventh transistor; and a thirteenth transistor that is current-mirror coupled to the twelfth transistor to acquire the current to be added to the second signal before the comparator makes a comparison; and wherein the second compensation circuit includes a fourteenth transistor that amplifies a current flowing in a direction opposite to a direction in which the second signal flows due to the common mode noise superimposed on the second signal;

a fifteenth transistor that forms a load on the fourteenth transistor, and a sixteenth transistor that is current-mirror coupled to the fifteenth transistor to acquire the current to be added to the first signal before the comparator makes a comparison.

9. The communication circuit according to claim 8, wherein the thirteenth transistor is coupled so that a current flowing in the thirteenth transistor is added to the second signal before the comparator makes a comparison, and wherein the sixteenth transistor is coupled so that a current flowing in the sixteenth transistor is added to the first signal before the comparator makes a comparison.

10. A semiconductor device comprising:

a voltage measurement function section that measures a voltage of an assembled battery obtained by series-coupling a plurality of unit cells; and a communication function section that is capable of communicating a voltage measurement result produced by the voltage measurement function section;

wherein the communication function section includes a receiver circuit that provides differential communication by using a first transmission path and a second transmission path, the first transmission path being used to transmit a first signal, the second transmission path being used to transmit a second signal, the second signal being in opposite phase to the first signal;

wherein the receiver circuit includes:

a compensation circuit that compensates for an attenuation of a current when common mode noise is superimposed on the first signal and on the second signal, wherein the compensation circuit includes:

a first compensation circuit; and a second compensation circuit;

wherein the first compensation circuit detects an electric current attenuation of the first signal when the common mode noise is superimposed on the first signal, and compensates for the attenuation of the first signal by adding the detected electric current attenuation to the second signal, and wherein the second compensation circuit detects an electric current attenuation of the second signal when the common mode noise is superimposed on the second signal, and compensates for the attenuation of the second signal by adding the detected electric current attenuation to the first signal.

* * * * *